United States Patent [19]

Acker

[11] 4,086,536
[45] Apr. 25, 1978

[54] SINGLE SIDEBAND TRANSMITTER APPARATUS

[75] Inventor: William F. Acker, Seminole, Fla.

[73] Assignee: Honeywell Inc., Minneapolis, Minn.

[21] Appl. No.: 589,953

[22] Filed: Jun. 24, 1975

[51] Int. Cl.² ........................ H04B 1/68; H03C 1/52
[52] U.S. Cl. ........................................ 325/137; 332/45
[58] Field of Search ............... 325/45, 137, 50, 42, 325/43, 38 A; 332/44, 45; 179/15 FS, 15 FD; 178/68; 235/181

[56] References Cited

U.S. PATENT DOCUMENTS

| | | | |
|---|---|---|---|
| 3,388,330 | 6/1968 | Kretzmer | 325/42 |
| 3,560,654 | 2/1971 | Darlington | 179/15 FS |
| 3,573,380 | 4/1971 | Darlington | 332/45 X |
| 3,573,622 | 4/1971 | Holzman et al. | 178/68 X |
| 3,585,529 | 6/1971 | Darlington | 332/45 |
| 3,688,196 | 8/1972 | Doelz | 325/50 X |
| 3,868,601 | 2/1975 | MacAfee | 332/45 |
| 3,875,340 | 4/1975 | Roy et al. | 179/15 FS X |

Primary Examiner—Robert L. Griffin
Assistant Examiner—Aristotelis M. Psitos
Attorney, Agent, or Firm—Theodore F. Neils

[57] ABSTRACT

A new single sideband transmitter is disclosed which permits use of single sideband techniques with less stringent requirements for the filters used therewith. An especially advantageous version can be constructed for a digitized discrete time system including converting the input data to a partial response format.

34 Claims, 11 Drawing Figures

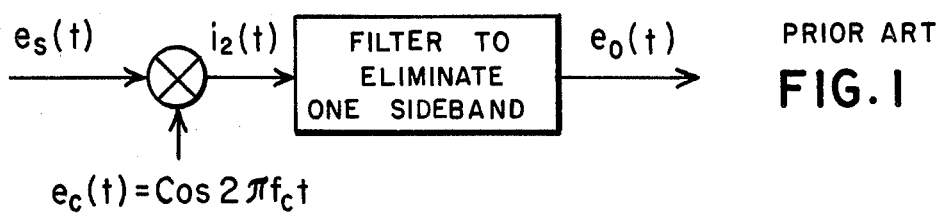
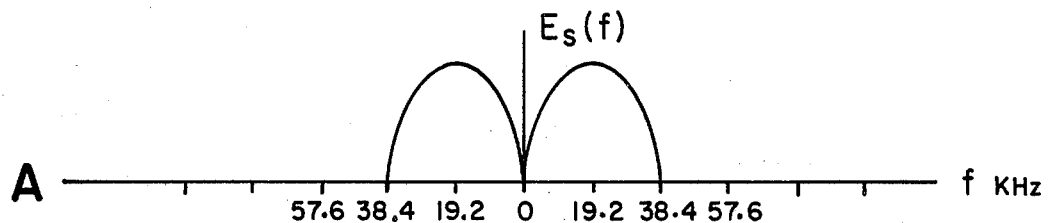
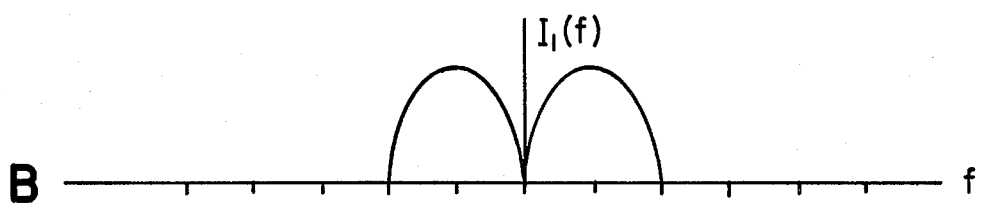
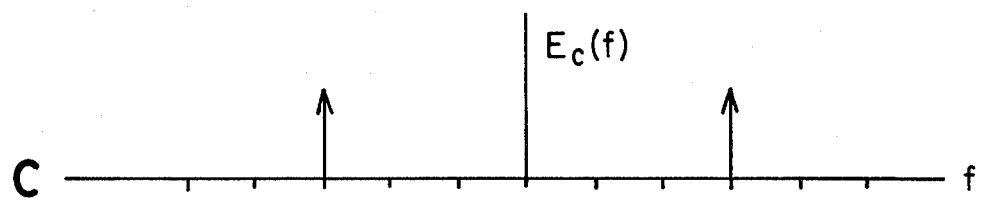
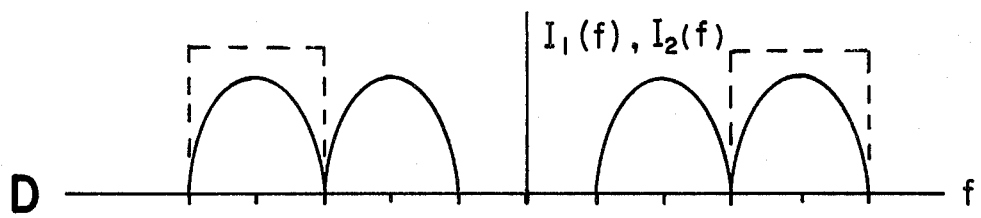
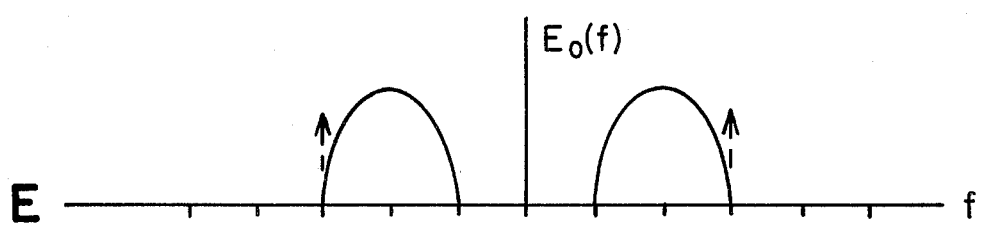
FIG. 2

SINGLE SIDEBAND TRANSMITTER APPARATUS

The invention herein described was made in the course of or under a contract, or subcontract thereunder, with the Department of the Air Force.

BACKGROUND OF THE INVENTION

This invention relates to a single sideband transmitter apparatus for translating input signals to other frequency bands.

As is well known, there are substantial difficulties in implementing single sideband transmitters. This is because the common conceptual versions of the single sideband transmitter either require that a relative 90° phase shift be introduced across the entire baseband signal or that there be an ideal rectangular bandpass filter characteristic provided on one side or the other of the carrier frequency to filter off the unwanted sideband. This filter can be less than ideal if the baseband signal does not have zero and low frequency components contained therein such as may be found with voice information signals or with data channels using certain partial response techniques. Nevertheless, there are often difficult requirements to be met and the filters in these circumstances must still have excellent characteristics for operation in a high frequency band for filtering off the unwanted sideband of a translated baseband signal.

FIG. 1 shows a prior art system using a bandpass filter to eliminate the unwanted sideband. A signal $e_s$ is used to modulate a carrier in a product device, a balanced modulator, and the resulting translated signal having two sidebands, the intermediate signal $i_2(t)$, is supplied to a bandpass filter to eliminate one of the sidebands. FIG. 2 shows the sequence of steps along the Fourier frequency axis in a series of magnitude versus frequency diagrams.

Frequency axis A in FIG. 2 shows the arbitrarily assumed frequency content of the signal $e_s$. Skipping frequency axis B for the moment, frequency axis C shows the representation of the carrier wave $e_c(t)$, a Dirac delta function or frequency impulse in the frequency domain. Since $e_s(t)$ is multiplied with the carrier $e_c(t)$ in the time domain as indicated in FIG. 1 to provide $i_2(t)$, the representations on frequency axes A and C are to be convolved with one another in the frequency domain to produce the results shown on frequency axis D. The intermediate signal represented along frequency axis D is applied to the idealized rectangular filter (represented by the dotted lines along frequency axis D) and the result is shown on frequency axis E where the lower sideband has been arbitrarily retained.

FIG. 3 shows the well known 90° phase shift method of generating a single sideband output signal. Again, the magnitude versus frequency plots of FIG. 2 can be used to show the frequency axis effects of the operations shown in FIG. 3. The frequency content of the input signal $e_s(t)$ is again that shown on frequency axis A and the 90° phase shifted input signal, $i_1(t)$, is shown on frequency axis B. Both carrier waves $e_c(t)$ and $e'_c(t)$ can be represented by the frequency impulses on Dirac delta functions shown on frequency axis C. The two carrier waves represented on frequency axis C are convolved with the signals shown on frequency axes A and B, respectively, with the results of each convolution shown on frequency axis D corresponding to intermediate signals $i_2(t)$ and $i_3(t)$, where the idealized filter characteristic is now to be ignored. Both signals can be so represented since no phase information is included in these magnitude versus frequency plots.

By combining the two convolution results shown on frequency axis D in FIG. 2 by the summer shown in FIG. 3, the output signal results are obtained, $e_o(t)$ and the output signal frequency content is shown on axis E, again the lower sideband being arbitrarily retained. The position of the carrier wave frequency if present, would be that shown by the dotted-in impulses along frequency axis E. They are not present given the transmitter shown but are usually inserted at the transmitter for demodulation purposes at the receiver.

The input signal in both of the foregoing cases has been shown with no zero frequency component and the sidebands in the baseband signals could be pulled back some from zero frequency to ease the filtering required in the filtered version, a limitation which may be satisfactory in a voice channel where voice frequency components near zero are negligible. Also, the frequency axis of the input signal, axis A, has been labelled with some arbitrary frequencies for purposes of comparison with later Figures and these frequencies are intended to apply to the frequency axes set out below frequency axis A.

FIG. 4 represents an extended version of FIG. 3 in that a sampled data source is assumed rather than an analog source which led to the diagrams of FIG. 2. The sample data source provides samples at the rate of 1/T samples per second to form $e_s(kT)$. Assuming that an ideal sampling situation exists, an ideal lowpass filter having a rectangular characteristic with a cutoff of 1/(2T) hertz can be used to recover the analog signal which was sampled to provide the signal $e_s(kT)$. The signal at the output of the ideal lowpass filter will then be $e_s(t)$. The remainder of FIG. 4 is then that of FIG. 3. An analysis of the system of FIG. 4 in the time domain is of interest for later comparison and is set out as follows to give the derivation of the output signal.

By use of the Dirac delta function $\delta(t-t_o)$, the sequence of input data samples $e_s(kT)$ can be written in terms of a continuous time parameter as follows:

$$\bar{e}_s(kT \to t) = \sum_n A_n \delta(t - nT)$$

This signal is applied to the ideal low pass filter having a rectangular characteristic along the Fourier frequency axis with a cutoff frequency of 1/(2T) hertz. Such a filter has an impulse response as follows:

$$h(t) = \frac{\sin \pi \frac{t}{T}}{\pi \frac{t}{T}}$$

The result at the output of the filter is $e_s(t)$:

$$e_s(t) = \bar{e}_s(kT \to t) * h(t) = \sum_n A_n \frac{\sin \pi(\frac{t}{T} - n)}{\pi(\frac{t}{T} - n)} =$$

$$\sum_n (-1)^n A_n \frac{\sin (\pi \frac{t}{T})}{\pi(\frac{t}{T} - n)}$$

This result is multiplied by the first carrier wave in the multiplier provided in the upper leg of the second section of the transmitter in FIG. 4 to provide intermediate signal $i_2(t)$:

$$i_2(t) = e_c(t)e_s(t) = \cos(2\pi f_c t) \sum_n (-1)^n A_n \frac{\sin 2\pi(\frac{t}{2T})}{\pi(\frac{t}{T} - n)} =$$

$$\sum_n (-1)^n A_n \frac{\sin 2\pi(f_c + \frac{1}{2T})t - \sin 2\pi(f_c - \frac{1}{2T})t}{2\pi(\frac{t}{T} - n)}$$

where the last equation is obtained by using the following trigonometric identity:

$$2\cos x \sin y = \sin(x+y) - \sin(x-y)$$

As is well known, phase shifting a signal by 90° can be accomplished by taking the Hilbert transform of the signal. The pertinent Hilbert transform in this situation is the following:

$$Hi\left\{\frac{\sin x}{x}\right\} = \frac{\cos - 1}{x}$$

Thus, taking the Hilbert transform of $e_s(t)$ provides the second intermediate signal to be applied to the second multiplier, $i_2(t)$:

$$i_1(t) = Hi\{e_s(t)\} = Hi\left\{\sum_n A_n \frac{\sin \pi(\frac{t}{T} - n)}{\pi(\frac{t}{T} - n)}\right\} =$$

$$\sum_n A_n \frac{\cos(\pi(\frac{t}{T} - n)) - 1}{\pi(\frac{t}{T} - n)} = \sum_n A_n \frac{-1 + (-1)^n \cos(\pi \frac{t}{T})}{\pi(\frac{t}{T} - n)}$$

The second multiplier in the lower leg of the remainder of the transmitter multiplies the quadrature carrier wave, $e'_c(t)$, with $i_1(t)$ to provide the third intermediate signal, $i_3(t)$ giving the following result:

$$i_3(t) = e'_c(t)i_1(t) = \sin(2\pi f_c t) \sum_n A_n \frac{-1 + (-1)^n \cos 2\pi \frac{t}{2T}}{\pi(\frac{t}{T} - n)} =$$

$$\sum_n A_n \frac{-2\sin 2\pi f_c t + (-1)^n \{\sin 2\pi(f_c + \frac{1}{2T})t + \sin 2\pi(f_c - \frac{1}{2T})t\}}{2\pi(\frac{t}{T} - n)}$$

The two intermediate signals, $i_2(t)$ and $i_3(t)$ are then combined in the summer shown in FIG. 4 to provide the output signal $e_o(t)$. The results is shown below:

$$e_o(t) = i_2(t) - i_3(t) = \sum_n A_n \frac{\sin 2\pi f_c t - (-1)^n \sin 2\pi(f_c - \frac{1}{2T})t}{\pi(\frac{t}{T} - n)}$$

This can be rewritten as follows:

$$e_o(t) = \left\{\sum_{\substack{n \\ \text{even}}} A_n \frac{\sin 2\pi f_c t - \sin 2\pi(f_c - \frac{1}{2T})t}{\pi(\frac{t}{T} - n)}\right\} +$$

$$\left\{\sum_{\substack{n \\ \text{odd}}} A_n \frac{\sin 2\pi f_c t + \sin 2\pi(f_c - \frac{1}{2T})t}{\pi(\frac{t}{T} - n)}\right\}$$

This analysis shows a form that can be taken by a single sideband transmitter in providing an analog output signal with a sample data input signal.

The earlier discussions indicated that often an ideal 90° relative phase shift apparatus is required to provide an acceptable single sideband transmitter or, alternatively, that excellent bandpass filters passing frequencies near the carrier wave frequency are required. The difficulty of implementing these kinds of devices makes use of a single sideband transmitter difficult and a single sideband transmitter avoiding such devices insofar as possible is therefore quite desirable.

SUMMARY OF THE INVENTION

The present invention provides a single sideband transmitter by using a pair of frequency translators in each of two signal paths, the input signal being applied to each signal path and the output signals from each signal path being combined by a summing means to provide the single sideband transmitter output. The corresponding translating means in each of the paths operate using periodic carrier waves to effect the frequency translations required. Typically, the signal in each signal path is in quadrature with the other. The first translator in each path operates at a frequency related to the bandwidth of the input signal which allows reducing the filtering problem to use of a lowpass filter while the remaining two translators operate to establish the carrier frequency.

By a proper selection of frequencies, a discrete time version of the single sideband transmitter can have its hardware requirements substantially reduced. Further, the input signal may be converted to a partial response signal format by selected convolution operations occurring along each of the signal paths.

BRIEF DESCRIPTION OF THE DRAWINGS

FIG. 1 shows a prior art single sideband system,

FIG. 2 shows a sequence of Fourier transforms for signals occurring in the systems shown in FIGS. 1 and 3.

DESCRIPTION OF THE PREFERRED EMBODIMENTS

Figure 5:
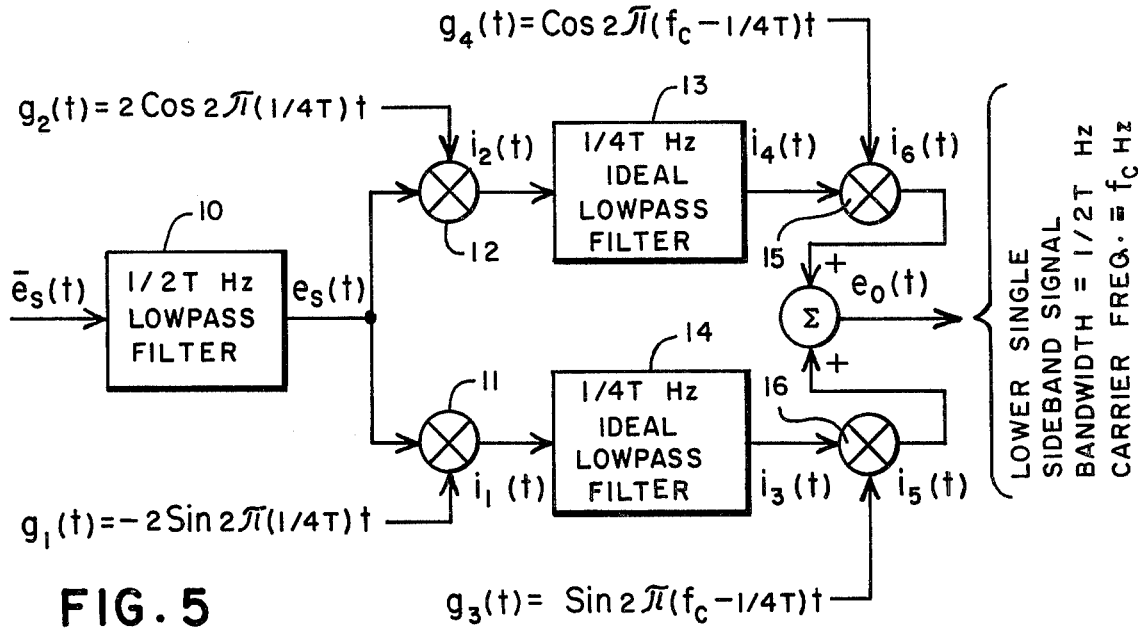
FIG. 5 shows a single sideband transmitter of the present invention.

FIG. 5 shows a single sideband transmitter of the present invention indicating the use of ideal rectangular characteristic lowpass filters, though these filters can be less than ideal with some restricting the input signal frequency content from around its reference values as will be shown below. FIG. 5 shows an unfiltered analog signal, $\bar{e}_s(t)$, applied to a lowpass filter, 10. This filter has no particular requirements beyond restricting the bandwidth of the signal applied to it to having a frequency content less than 1/2T hertz and, of course, passing substantially unaltered the desired frequency components. The signal output of this filter is labelled $e_s(t)$.

Signal $e_s(t)$ is then applied to two multiplier devices, 11 and 12, serving as translating means to translate $e_s(t)$ along the Fourier frequency axis. The signals $g_1(t)$ and $g_2(t)$ are periodic translating signals and they can be seen to be in quadrature with one another.

Figure 6:
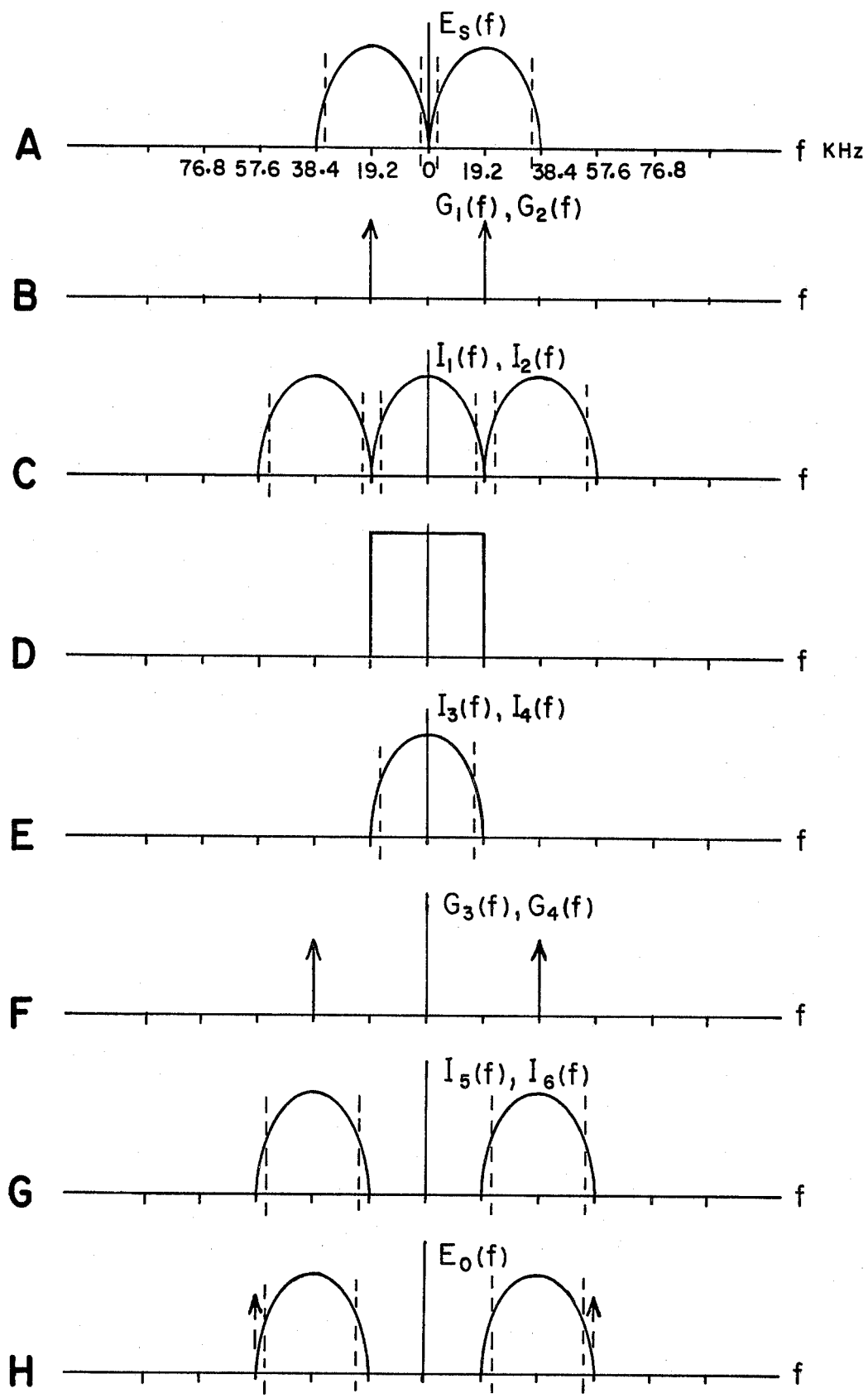
FIG. 6 shows a sequence of Fourier transforms for signals occurring in system shown in FIG. 5.

Turning to FIG. 6, the assumed Fourier transform of $e_s(t)$ is shown along Fourier frequency axis A with 38.4 kilohertz arbitrarily taken to represent the 1/2T hertz cutoff frequency of the input lowpass filter. The Fourier transform of $e_s(t)$ in FIG. 6 is assumed to be that shown in FIG. 2 with the frequency content present on either side of the reference frequency, the zero frequency in FIG. 6, constituting an upper and a lower sideband or sidelobes.

The signals $g_1(t)$ and $g_2(t)$ can be represented by the frequency impulses or Dirac delta functions shown on frequency axis B. The effect of the multipliers 11 and 12 on $e_s(t)$, that is the time domain multiplication of $e_s(t)$ with $g_1(t)$ and $g_2(t)$ respectively, is a convolution in the frequency domain. The first convolved signal is the intermediate signal labelled $i_1(t)$ in FIG. 5 and the second convolved signal is labelled $i_2(t)$ in FIG. 5. Both of these intermediate signals can be represented by the Fourier transform shown on frequency axis C in FIG. 6.

The functions shown on frequency axis C in FIG. 6 show that the Fourier transform of the signal $e_s(t)$, shown along frequency Axis A in FIG. 6, has been shifted up and down from zero frequency first by just half of the bandwidth taken up by one of the side lobes or sidebands of the signal $e_s(t)$ as it occurs between the first reference frequency, zero frequency, and the outer reference frequencies, 1/2T hertz or 38.4 khz. Replicas, possibly scaled in amplitude (shown here equal), of the upper sideband and the lower sideband of $e_s(t)$ each occur symmetrically about the first reference frequency, zero frequency, in both $i_1(t)$ and in $i_2(t)$. Each of the sidebands or lobes which now includes the reference frequency takes an equal bandwidth on either side of the reference frequency to thereby each take a minimum bandwidth along frequency axis C. Though each of the signals $i_1(t)$ and $i_2(t)$ can be represented by the diagram along the frequency axis C in FIG. 6, they should be remembered to be each in quadrature with one another and that the phase information is not shown on these magnitude versus frequency plots.

Returning to FIG. 5, it can be seen that the next operation on signals $i_1(t)$ and $i_2(t)$ is to apply each to an ideal rectangular characteristic lowpass filter having a cutoff of 1/4T hertz or 19.2 kilohertz as is shown along frequency axis D in FIG. 6. These lowpass filters are labelled 13 and 14 in FIG. 5. Filtering represents merely multiplication by the filter characteristic in the frequency domain and so, when this is done with the signals represented along frequency axis C, the result is that shown along frequency axis E. That is to say, that intermediate signal $i_3(t)$ and intermediate signal $i_4(t)$ can each be represented by the Fourier transform shown along frequency axis E in FIG. 6, but, again, these two signals should be remembered to be in quadrature and that no phase information is shown. Notice that the signal information which was carried by $e_s(t)$ and which took a bandwidth equal to the frequencies taken up by the sidebands shown along frequency axis A, now is contained in the bandwidth taken up by only one of the sidebands as shown along frequency axis E. Thus, $i_3(t)$ and $i_4(t)$ each take only bandwidth of 1/4T or 19.2 kilohertz and each, in quadrature with the other, carries half of the signal information.

These signals are applied to two further multiplier devices, 15 and 16, in FIG. 5, again serving as translating means. These multipliers translate signals $i_3(t)$ and $i_4(t)$ along the frequency axis until they are positioned in the desired single sideband position on the frequency axis. Here, the lower single sideband position is to be chosen to match the lower single sideband position shown along frequency axis E in FIG. 2 for comparison and so will be between 19.2 kilohertz and 57.6 kilohertz. Other carrier wave frequencies can be selected by varying the frequency of $g_3(t)$ and $g_4(t)$.

The output signals from the multipliers 15 and 16, $i_5(t)$ and $i_6(t)$, represent the multiplication of the time domain signals $g_3(t)$ with $i_3(t)$ and $g_4(t)$ with $i_4(t)$, respectively. In the frequency domain, these multiplications are convolutions and the result is shown on frequency axis G in FIG. 6. The summing of $i_5(t)$ and $i_6(t)$ by summing means 17 provides the output signal, $e_o(t)$. The frequency content of $e_o(t)$ is shown along frequency axis H in FIG. 6. For the signals $g_1(t)$, $g_2(t)$, $g_3(t)$ and $g_4(t)$ shown in FIG. 5, and the signs shown at the output summing means, 17, a lower side lobe single sideband signal will result. Changes in sign or phase can provide the other sideband.

Each of the lobes shown along frequency axis H represents the lower sideband of a single sideband signal so that the position of the carrier frequency, had it been present, is shown by the dotted impulses along frequency axis H. The carrier is not present and can be inserted at the transmitter for demodulation purposes at the receiver as was also shown along frequency axis E in FIG. 2. The dotted-in impulses along frequency axis H in FIG. 6 are then actually present. Thus, the result shown at frequency axis H in FIG. 6 matches the result shown at frequency axis E in FIG. 2.

That a lower sideband, single sideband signal results from the system of FIG. 5 can be shown in the following analysis in the time domain. Let $e_s(t)$ be represented by a Fourier series as follows:

$$e_s(t) = \sum_n R_n \cos(2\pi\omega_n t + \theta_n)$$

where $0 \leq \omega_n \leq 1/(2T)$ for all $n$.

Then $i_1(t)$ is the result of multiplying $e_s(t)$ and $g_1(t)$ giving:

$$i_1(t) = g_1(t)e_s(t) = -2\sin[2\pi(\frac{1}{4T})t] \sum_n R_n \cos(2\pi\omega_n t + \theta_n) =$$

$$-\sum_n R_n \{\sin[2\pi(\frac{1}{4T} + \omega_n)t + \theta_n] + \sin[2\pi(\frac{1}{4T} - \omega_n)t - \theta_n]\}$$

$i_1(t)$ is applied to an ideal lowpass filter which removes all frequencies above 1/4T hertz which effectively removes the first term in the braces in $i_1(t)$ so that $i_3(t)$ is the following:

$$i_3(t) = -\sum_n R_n \sin[2\pi(\frac{1}{4T} - \omega_n)t - \theta_n]$$

Then multiplying $i_3(t)$ by $g_3(t)$ yields $i_5(t)$:

$$i_5(t) = g_3(t)i_3(t) = \sin[2\pi(f_c - \frac{1}{4T})t]\{-\sum_n R_n \sin[2\pi(\frac{1}{4T} - \omega_n)t - \theta_n]\} = -\sum_n \frac{R_n}{2}\{-\cos[2\pi(f_c - \omega_n)t - \theta_n] +$$

-continued $$\cos [2\pi(f_c - \frac{1}{2T} + \omega_n)t + \theta_n]\}$$

A similar analysis provides the following for $i_6(t)$:

$$i_6(t) = \sum_n \frac{R_n}{2} \{\cos [2\pi(f_c - \omega_n)t - \theta_n] + \cos [2\pi(f_c - \frac{1}{2T} + \omega_n)t + \theta_n]\}$$

The output signal $e_o(t)$, is then found by combining equations $i_5(t)$ and $i_6(t)$ additively and gives the following:

$$e_o(t) = i_5(t) + i_6(t) = \sum_n R_n \cos [2\pi(f_c - \omega_n)t - \theta_n]$$

This is obviously a lower single sideband signal with a carrier at $f_c$ hertz. For the receiver to demodulate this signal a carrier must be inserted in $e_o(t)$ and sent along therewith.

The result of using such a carrier can be shown to be the signal $e_s(t)$. Choose the carrier sent along with $e_o(t)$ to be the following:

$$e_c(t) = 2 \cos 2\pi f_c t.$$

Using this carrier signal to coherently demodulate $e_o(t)$ by multiplication yields:

$$e_{demod}(t) = e_c(t)e_o(t) = 2\cos (2\pi f_c t) \sum_n R_n \cos[2\pi(f_c - \omega_n)t - \theta_n]$$
$$= \sum_n R_n \{\cos [2\pi(2f_c - \omega_n)t - \theta_n] + \cos [2\pi \omega_n t + \theta_n]\}$$

Removing the higher frequency components by filtering with a lowpass filter removes the first term in the above equation near the carrier frequency and leaves the following for the receiver output signal:

$$e_{recv}(t) = \sum_n R_n \cos (2\pi \omega_n t + \theta_n).$$

Note that this is identical to the representation for the signal $e_s(t)$ showing that a lower single sideband signal is provided by the transmitter from which the baseband signal may be received at the receiver in the usual way for single sideband signals.

In FIG. 6, the vertical dashed lines indicate the frequencies which the frequency lobes or sidebands of the input signal shown on frequency axis A might approximately be confined if a filter having a characteristic other than the ideal filter with a characteristic shown along frequency axis D in FIG. 6 is to be used. Such a spectrum for the input signal would be quite suitable for a voice signal channel, for instance, since low frequency signal components are not required to satisfactorily transmit voice data.

That portion of the transmitter shown in FIG. 5 beyond the initial two translating means 11 and 12, typically doubly balanced modulators, can be viewed as a quadrature carrier, double sideband transmitter. The signals in either leg of the transmitter are uncorrelated.

The input signal was assumed to have the signal content shown in FIG. 6 provided symmetrically around a zero reference frequency. However, the input signal can also be provided around other reference frequencies as a bandpass signal, or around zero frequency as a bandpass signal for that matter, and the transmitter principles shown by the transmitter of FIG. 5 can provide a transmitter to translate this bandpass input signal to another frequency range in single sideband form. Of course, different frequencies than appear in FIGS. 5 and 6 would be required for the first translating but these frequencies would be similarly related to the frequency content of the input signal.

Figure 7:
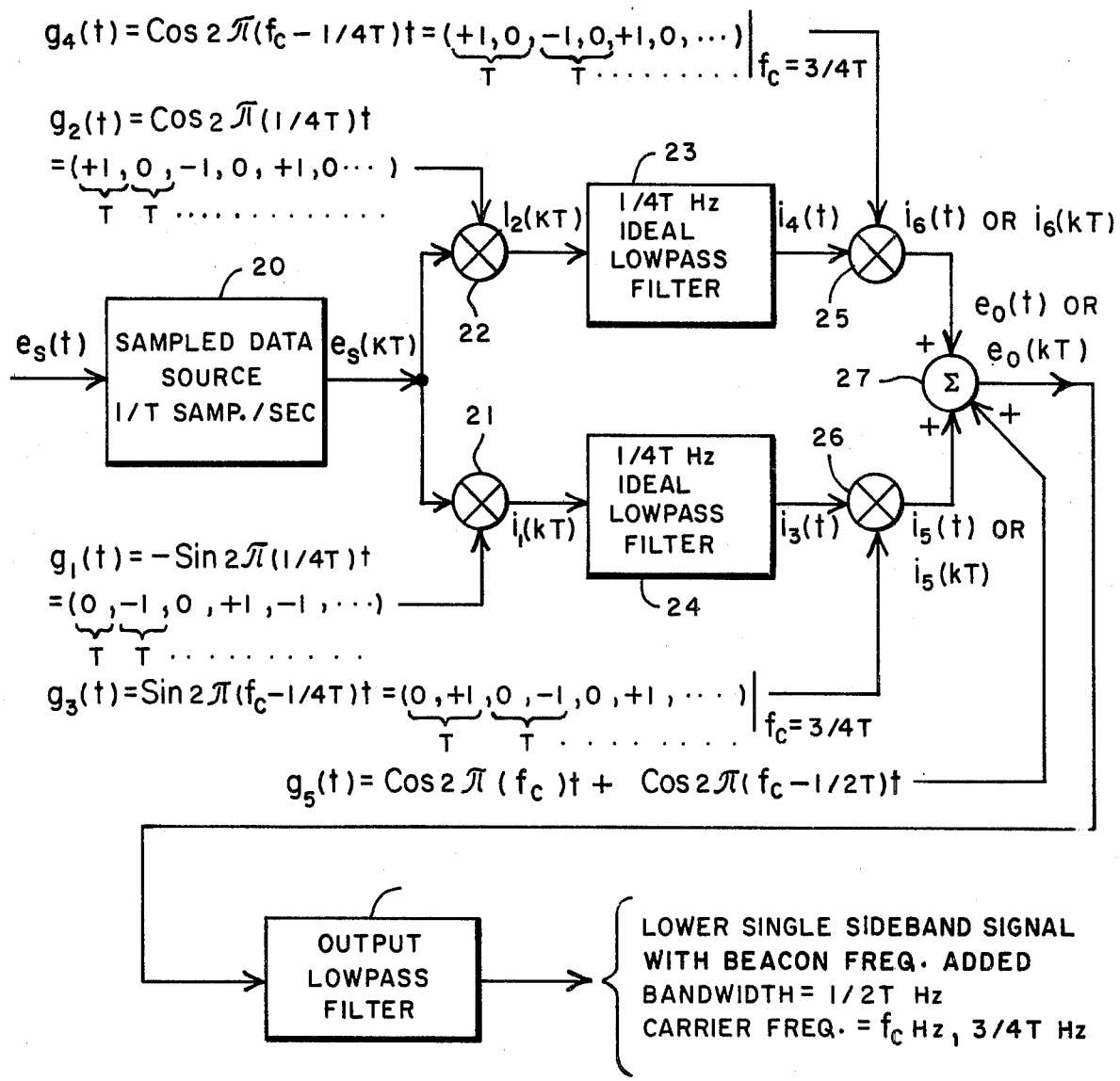
FIG. 7 shows a sampled data version of FIG. 5.

A discrete time or sampled data version of the system of FIG. 5 is shown in FIG. 7. There, a sample data source, 20, is provided equivalent to the sample data source shown in the prior art single sideband transmitter of FIG. 4, where again samples are provided at the rate of 1/T samples/second to form the signal $e_s(kT)$. This signal, $e_s(kT)$ is supplied to two multiplier devices serving as translating means, 21 and 22, which receive signals $g_1(t)$ and $g_2(t)$ to be multiplied with $e_s(kT)$ for the translation in frequency of $e_s(kT)$. The signals $g_1(T)$ and $g_2(t)$ may be sinusoidal waves as shown in FIG. 7. However, in each sample period T, the sample source 20 provides one input data sample which may be assumed to occur at the beginning of period T. The values of $g_1(t)$ and $g_2(t)$ for the sinusoidal wave shown at the beginning of each period key is shown in parentheses and since the signal $e_s(kT)$ is non-zero only at the beginning of the sample period $T_1$ as assumed, the numbers in the parentheses which are shown equaling $g_1(t)$ and $g_2(t)$ are the only effective values in a given sample period T.

Figure 8:
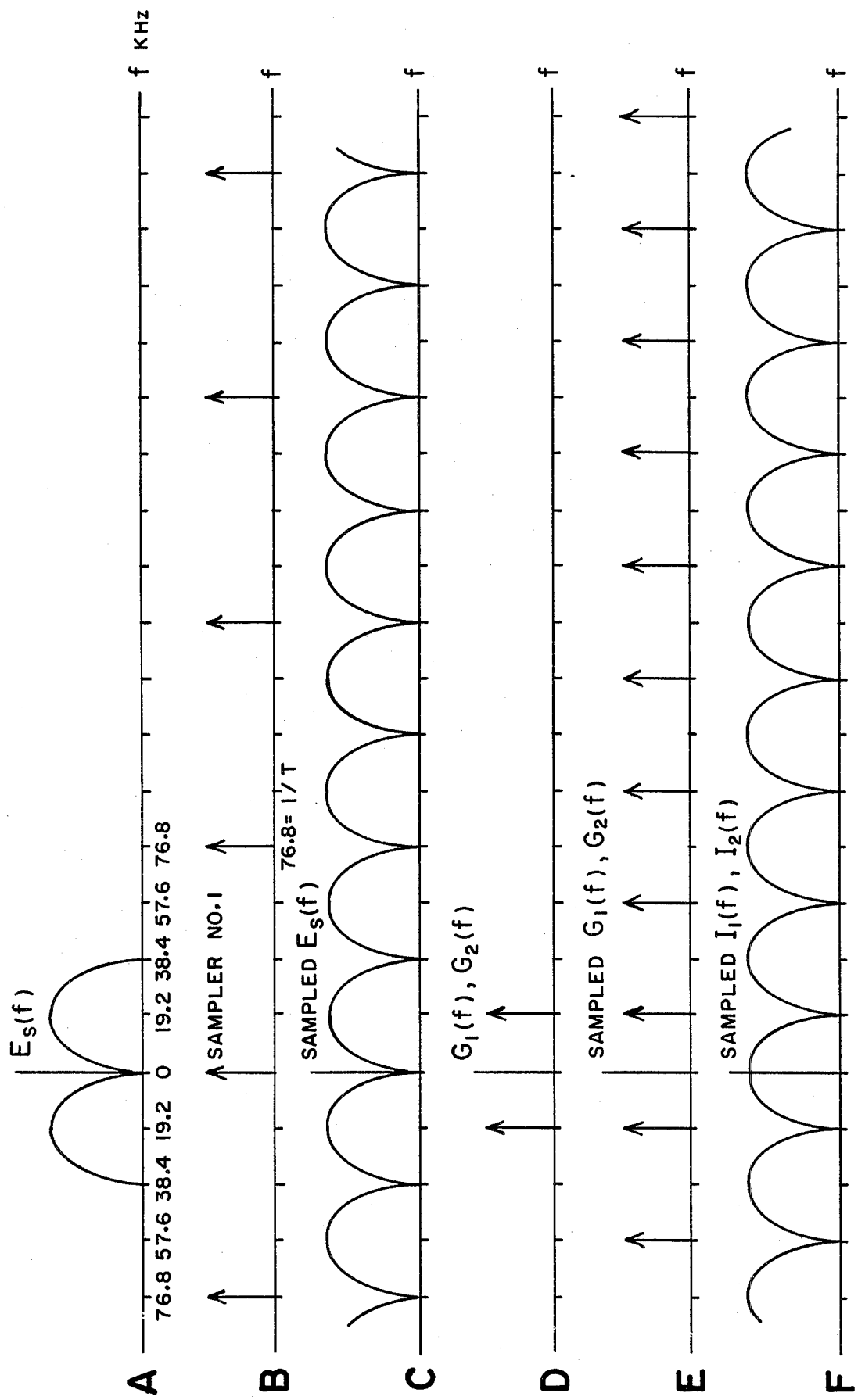
FIG. 8 shows a sequence of Fourier transforms for signals occurring in the system shown in FIG. 7.
Figure 8:
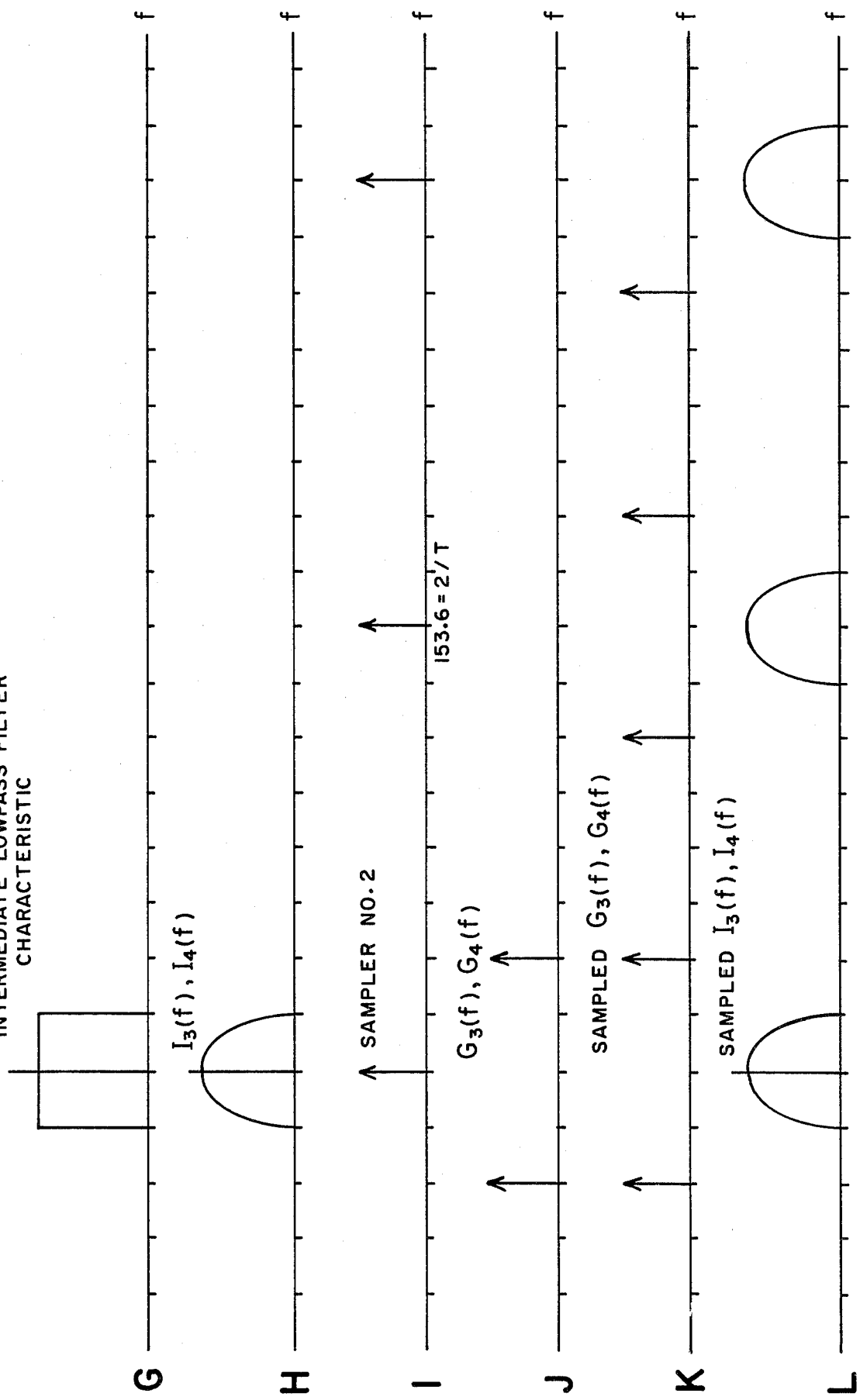
Figure 8:
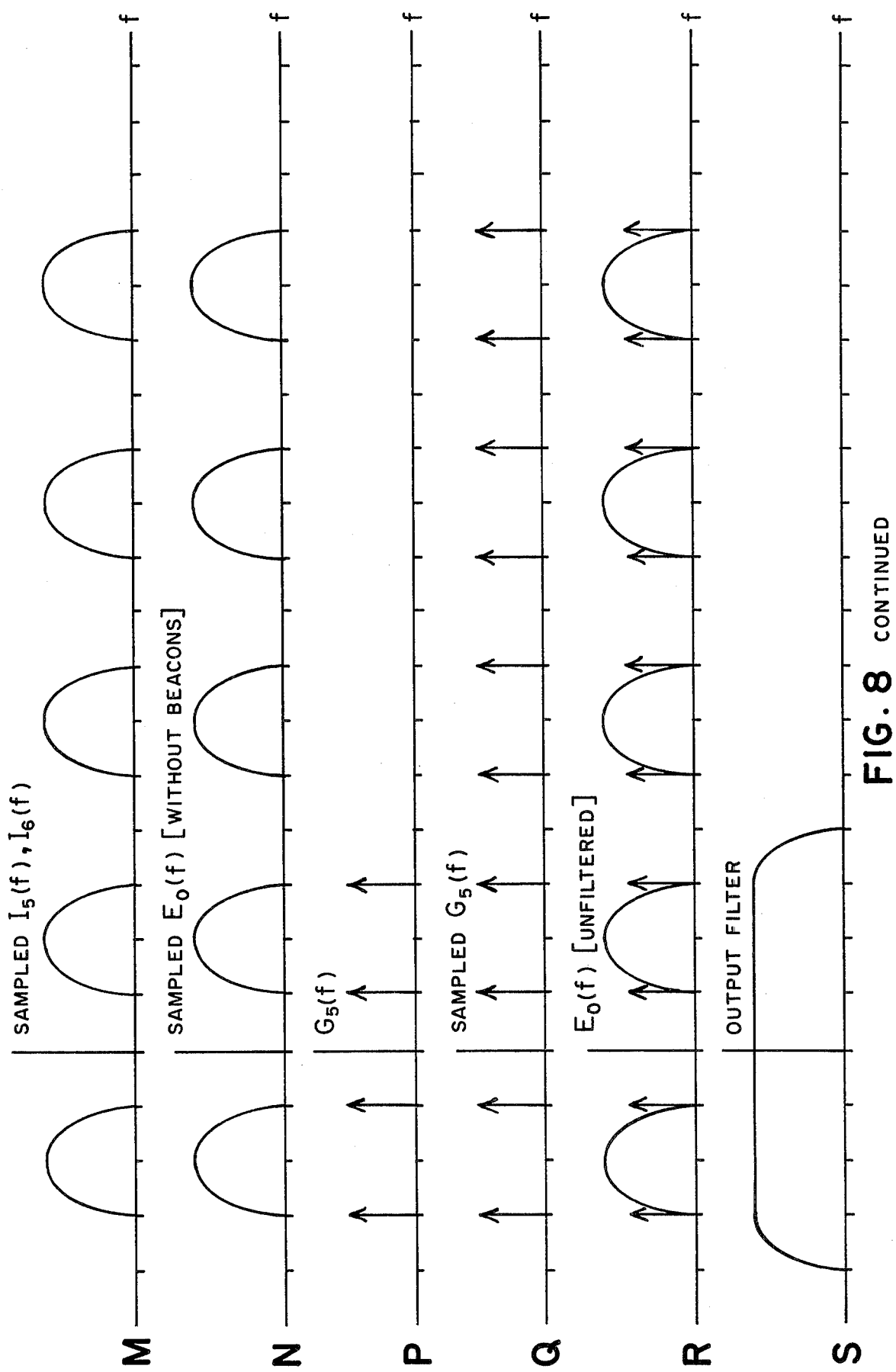
Figure 8:
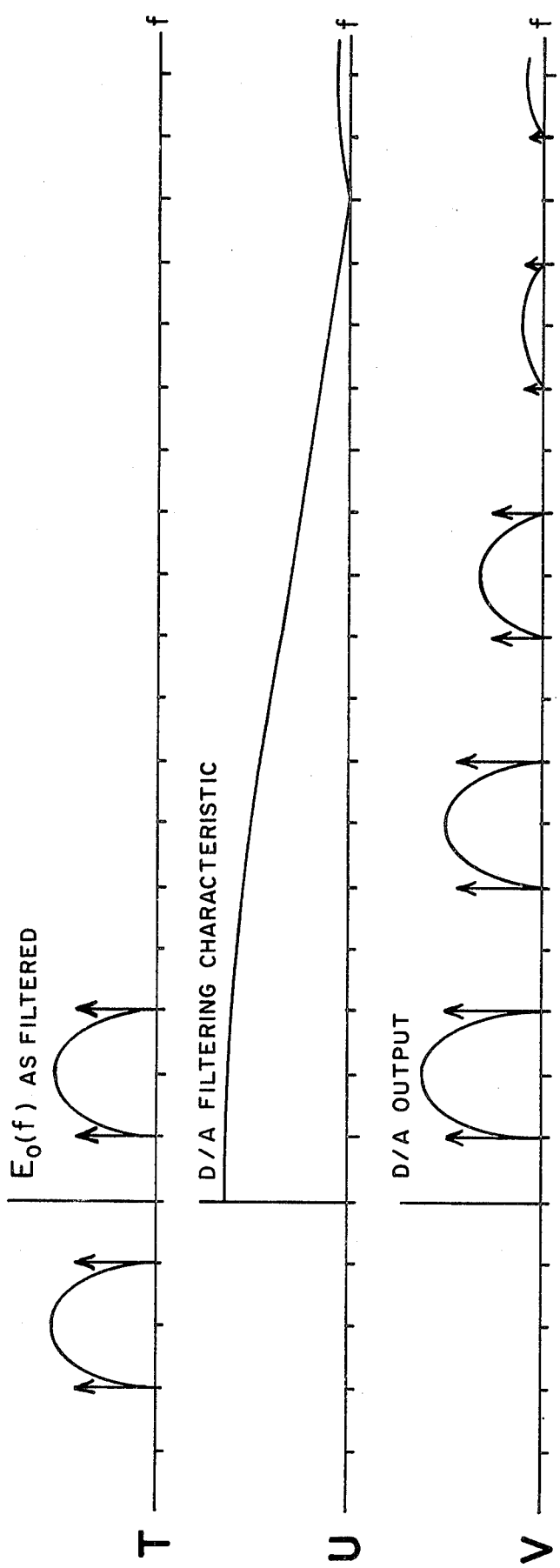

This being the case, the sequence as shown in the parentheses for $g_1(t)$ and $g_2(t)$ can be taken to be the result of sampling $g_1(t)$ at the same rate at which the sample data source 20 provides samples, each sample being taken to occur at the beginning of a sample period of T seconds. Using this concept, the magnitude versus frequency diagrams shown in FIG. 8 represent the operations of the system of FIG. 7 in the frequency domain.

Again, Fourier frequency axis A shows the assumed frequency content of the input analog signal, $e_s(t)$. Frequency axis B shows the Fourier transform of the sampling function in the time domain and, as in the time domain, a series of frequency impulses or Dirac delta functions occurs along the frequency axis separated by the sampling frequency. Convolving $E_s(f)$ of frequency axis A with the Fourier transform of the sampling function shown along the frequency axis B provides the Fourier transform of the sampled input signal, $e_s(kT)$ shown on frequency axis C.

Frequency axis D shows the frequency domain representation of $g_1(t)$ and $g_2(t)$ without any sampling thereof. By convolving this representation shown along frequency axis D with the Fourier transform of the sampling function shown along frequency axis B to effectively sample $g_1(t)$ and $g_2(t)$, as indicated above, results in the diagram shown on frequency axis E is the Fourier transform of the sampled values of $g_1(t)$ and $g_2(t)$.

The outputs of the frequency translating means 21 and 22 are the intermediate signals $i_1(t)$ and $i_2(t)$. To obtain the frequency domain representation of these, the results shown on frequency axis C must be convolved with the results shown on frequency axis E to provide a representation for each of the signals which are both shown along frequency axis F.

Intermediate signals $i_1(t)$ and $i_2(t)$ are each applied to a lowpass filter having an ideal rectangular characteristic frequency response with a cutoff of 1/4T hertz. These filters, 23 and 24, have the ideal rectangular frequency characteristic shown along frequency axis G in FIG. 8. The results of this filtering of each of the signals $i_1(t)$ and $i_2(t)$ provides intermediate signals $i_3(t)$ and $i_4(t)$ which both have the representation in the frequency domain shown along frequency axis H of FIG. 8.

At this point intermediate signals $i_3(t)$ and $i_4(t)$ or the transforms thereof $I_3(f)$ and $I_4(f)$ are just the same as the corresponding intermediate signals $i_3(t)$ and $i_4(t)$ of FIG. 5 or $I_3(f)$ and $I_4(f)$ in FIG. 6. Thus in FIG. 6, frequency axes F through H represent the result obtained by the remainder of the transmitter portion as shown in FIG. 7, beyond the lowpass filters, applied to intermediate signals $i_3(t)$ and $i_4(t)$ if $g_3(t)$ and $g_4(t)$ of FIG. 7 are the analog signals shown in equation form thereon. This would then produce at the output of FIG. 7 as output signal $e_o(t)$, the result provided at the output of the transmitter in FIG. 5 with a frequency content as shown in FIG. 6. However, another possibility is to continue in the discrete time or sampled data format by using sampled versions of $i_3(t)$ or $i_4(t)$, for instance. Alternatively, $g_3(t)$ and $g_4(t)$ can be sampled, $g_3(t)$ and $g_4(t)$ being signals which are supplied to the second set of multiplier devices serving as translating means, 25 and 26. Obviously, both of these sets of signals can be sampled also.

As an example, choose to sample $g_3(t)$ and $g_4(t)$ and, for a particularly convenient arrangement, choose the carrier frequency $f_c = 3/4T$ hertz. This leaves the frequency of $g_3(t)$ and $g_4(t)$ at twice the frequency of $g_1(t)$ and $g_2(t)$ and this relationship is to be reflected in a doubling of the sampling rate associated with $g_1(t)$ and $g_2(t)$ or two samples in each input data sample period T. Again, take the first sampling instant to be at the beginning of the input data sample period T. Thus, the values of the sinusoidal waves for $g_3(t)$ and $g_4(t)$ at the beginning of an input data sample period T and, for uniform sampling, the values in the middle of a period T will together be the sampled values of $g_3(t)$ and $g_4(t)$ supplied to or by the translating means 25 and 26 in each period T. These values are given in the parentheses which are shown equaling the sinusoidal waves $g_3(t)$ and $g_4(t)$ in FIG. 7, where the number of samples is indicated to be two per input data sample period T.

The sampler for sampling $g_3(t)$ and $g_4(t)$ has a Fourier transform shown along frequency axis I in FIG. 8. The sinusoidal wave representation in the frequency domain for signals $g_3(t)$ and $g_4(t)$ are shown along frequency axis J. Convolving the Fourier transform of the sampling function along frequency axis I with the representation along frequency axis J provides the Fourier transform of the sampled signals $g_3(t)$ and $g_4(t)$ shown along frequency axis K in FIG. 8.

Since $g_3(t)$ and $g_4(t)$ have non-zero values only at the sampling instances, the intermediate signals $i_3(t)$ and $i_4(t)$ are also effectively sampled. The result of this effective sampling may be shown by convolving the Fourier transform of the sampling function shown along frequency axis I with the frequency domain representation for signals $i_3(t)$ and $i_4(t)$ as shown along frequency axis H, the result being shown along frequency axis L.

The translating means then provide signals $i_5(t)$ and $i_6(t)$ by multiplication in the time domain, or convolution in the frequency domain, of signals $g_3(t)$ with $i_3(t)$ and $g_4(t)$ with $i_4(t)$, respectively. The result of the convolving together the functions shown along frequency axes K and L is shown along frequency axis M in FIG. 8, these being the Fourier transforms of the output signals of the multipliers 25 and 26, signals $i_5(t)$ and $i_6(t)$.

Signals $i_5(t)$ and $i_6(t)$ are combined by a summing means, 27, to provide the output signals $e_o(kT)$. This result is shown along frequency axis N in FIG. 8.

As indicated above, the carrier frequency can be inserted at the transmitter for demodulation purposes at the receiver. Also, there may be other frequency beacons to be inserted for other purposes. In FIG. 7, $g_5(t)$ is added at the output and comprises a carrier wave plus another reference wave beacon of another frequency marking the other side of the lower sideband which is to be transmitted. The frequency domain representation of these carriers is shown along frequency axis P in FIG. 8. These may be added in a discrete time or sampled data format by convolving them, as represented along frequency axis P, with the second sampling function shown along the frequency axis I in FIG. 8 to provide the result shown along frequency axis Q. After combining the results along frequency axis Q with the output signal results shown along frequency axis N by the summing means 27, the output signal with frequency beacons from the transmitter of FIG. 7 is shown along frequency axis R is FIG. 8.

The unwanted harmonics occurring in the output signal shown along frequency axis R in FIG. 8 may be filtered off. A possible filter having a suitable filter characteristic for accomplishing this has the characteristic shown along frequency axis S of FIG. 8, this being the characteristic of a lowpass filter. The result of the filtered output signal is shown along frequency axis T in FIG. 8. The result is similar to the result shown along frequency axis H in FIG. 6 with the exception of the added beacon. Of course, a bandpass filter might be used in place of a lowpass filter if the output signal desired is to be associated with a higher harmonic of $f_c$ rather than with $f_c$ itself.

The ideal lowpass filter shown in FIG. 7, requiring a rectangular filter characteristic and a constant delay in the passband, are, of course, impossible to construct. They may be satisfactorily approximated in some instances, the approximation becoming more satisfactory as the frequency content of the input signal is kept away from zero frequency and from the frequency cutoff of the filter. Thus, the vertical dashed lines shown in FIG. 6 could be inserted in FIG. 8 to provide the same indications therein as they do in FIG. 6.

Looking at FIG. 7, some possible implementation efficiencies immediately become apparent. The first of these concerns the translating means 21 and 22. The Nyquist bandwidth required for the sample data source providing samples at the rate of 1/T samples per second is just half of this, i.e. 1/2T hertz and the frequencies of $g_1(t)$ and $g_2(t)$ are just half again of this, as required to translate the frequency contents of the input signal shown in FIGS. 6 and 8. Given this fixed relationship between the frequency content of the input samples and the frequency of signals $g_1(t)$ and $g_2(t)$, the sequence of values in the parentheses show that only 0's, minus 1's and plus 1's are required to completely specify $g_1(t)$ and $g_2(t)$ for purposes of the transmitter shown in FIG. 7. Further, when one of these two signals has a value other than zero, the other signal has the value of zero.

Figure 9:
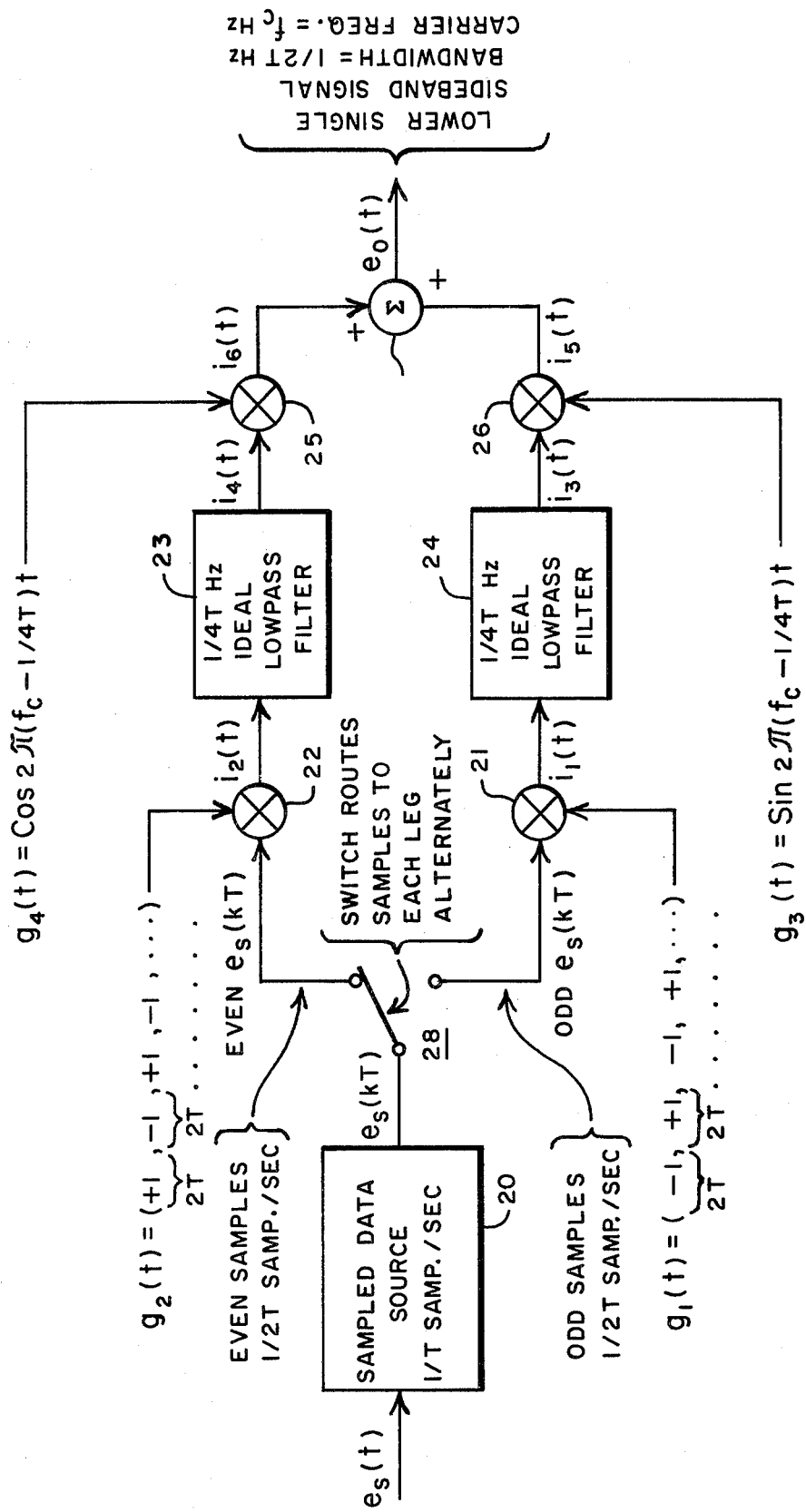
FIG. 9 shows an alternative version of the system shown in FIG. 7.

Thus, the resulting simplified system, which is shown in FIG. 9, can be used where an input switch, 28, directs every other, or alternate, input data sample to translator 21 and directs all the other samples to translator 22. This accomplishes the multiplication by zero of signals $g_1(t)$ and $g_2(t)$ by merely omitting to send a sample to a translator, which is to be multiplied by zero at that translator, when a sample is sent to the other translator which is to be multiplied by a $(+1)$ or a $(-1)$. The absence of an input leads to the absence of an output from the translator in the sample period T which is the same result as multiplying an input sample by zero. Thus, the samples supplied to translators 21 and 22 occur only once in a period of 2T. The switch 28 may be any suitable switch to supply the samples to the translators 21 and 22.

The samples arriving at translators 21 and 22 may then be routed through a non-inverting polarity signal path and an inverting polarity signal path, alternately, for each sample received at these translators. These signal paths might be amplifiers having, a course, unity gain or, for the non-inverting path, a direct connection. As another alternative, an inverting and a non-inverting amplifier can be connected to both receive all of the input samples and then use switching to direct the proper samples directly to the lowpass filters.

Figure 4:
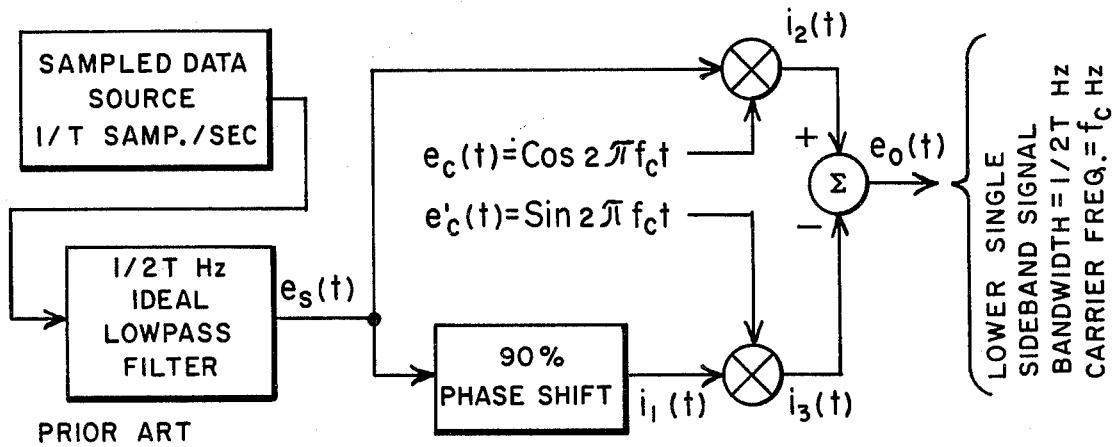
FIG. 4 shows an extended prior art single sideband transmitter for sampled data sources.

The system of FIG. 9 can be shown to provide a single sideband output by deriving its output and comparing it with the earlier derived output for the prior art single sideband transmitter of FIG. 4 having sample data source input. The analysis started with writing $e_s(kT)$ as a function of continuous time as follows:

$$\overline{e_s}(kT \to t) = \sum_n A_n \delta(t - nT)$$

For the upper transmitter leg, the switch 28 changes this to the following signal:

$$\text{Even } \overline{e_s}(kT \to t) = \sum_{n_{even}} A_n \delta(t - nT).$$

Translating means 22 multiplies this signal with the sequence shown in the parentheses for $g_2(t)$ applied to each of the samples coming to translating means 22. The result is:

$$i_2(t) = g_2(t) [\text{Even } \overline{e_s}(kT \to t)] = \sum_{n_{even}} (-1)^{\frac{n}{2}} [A_n (t - nT)].$$

The signal $i_2(t)$ is applied to the ideal rectangular characteristic lowpass filter 23. This filter has the following impulse response:

$$h(t) = \frac{\sin \pi \frac{t}{2T}}{\pi \frac{t}{2T}}$$

This impulse response must be convolved with the signal $i_2(t)$ in the time domain giving the following results:

$$i_4(t) = i_2(t) * h(t) = \sum_{n_{even}} A_n (-1)^{\frac{n}{2}} \frac{\sin[2 \frac{1}{4T} \pi(t-nT)]}{2\pi \frac{1}{4T}(t-nT)}$$

The resulting signal, $i_4(t)$, is then multiplied in the time domain by signal $g_4(t)$ in translating means 25 to yield:

$$i_6(t) = g_4(t)i_4(t) = \cos[2\pi(f_c - \frac{1}{4T})t] \sum_{n_{even}} A_n(-1)^{\frac{n}{2}} \frac{\sin[2\pi \frac{1}{4T}(t-nT)]}{2\pi \frac{1}{4T}(t-nT)}$$

$$= \sum_{n_{even}} A_n(-1)^{\frac{n}{2}} \frac{\sin[2\pi(f_c t - \frac{t}{4T} + \frac{t}{4T} - \frac{n}{4})] - \sin[2\pi(f_c t - \frac{t}{4T} - \frac{t}{4T} + \frac{n}{4})]}{2 \times 2\pi \frac{1}{4T}(t-nT)}$$

$$= \sum_{n_{even}} A_n(-1)^{\frac{n}{2}} \frac{\sin(2\pi f_c t - \frac{\pi}{2} n) - \sin[2\pi(f_c - \frac{1}{2T})t + \frac{\pi}{2} n]}{2\pi \frac{1}{2T}(t-nT)}$$

$$= \sum_{n_{even}} A_n(-1)^{\frac{n}{2}} \frac{(-1)^{\frac{n}{2}} \sin(2\pi f_c t) - (-1)^{\frac{n}{2}} \sin[2\pi(f_c - \frac{1}{2T})t]}{\pi(\frac{t}{T} - n)}$$

$$i_6(t) = \sum_{n_{even}} A_n \frac{\sin(2\pi f_c t) - \sin[2\pi(f_c - \frac{1}{2T})t]}{\pi(\frac{t}{T} - n)}$$

A similar analysis for the odd samples proceeds as follows taking the odd samples signal provided by switch 28 for the lower transmitter leg:

$$\text{Odd } \overline{e_s}(kT \to t) = \sum_{n_{odd}} A_n \delta(t - nT)$$

This sample is multiplied by the signal $g_1(t)$ and translating means 21 to provide $i_1(t)$:

$$i_1(t) = g_1(t) [\text{Odd } \overline{e_s}(kT \to t)] = \sum_{n_{odd}} -1^{\frac{n+1}{2}} [A_n \delta(t-nT)]$$

The impulse response of filter 24 is the same as that of filter 23 and $i_3(t)$ is provided by convolving this filter response with $i_1(t)$ in the time domain giving:

$$i_3(t) = i_1(t) * h(t) = \sum_{n_{odd}} (-1)^{\frac{n+1}{2}} A_n \frac{\sin 2\pi \frac{1}{4T}(t-nT)}{2\pi \frac{1}{4T}(t-nT)}$$

Intermediate signal $i_5(t)$ is then obtained from translator 26 wherein $i_3(t)$ is multiplied with $g_3(t)$ to provide the following:

$$i_5(t) = g_3(t)i_3(t) = \sin 2\pi(f_c - \frac{1}{4T})t \sum_{n_{odd}} A_n(-1)^{\frac{n+1}{2}} \frac{\sin 2\pi(\frac{t}{4T} - \frac{n}{4})}{\pi \frac{1}{2}(\frac{t}{T} - n)}$$

$$= \sum_{n_{odd}} A_n(-1)^{\frac{n+1}{2}} \frac{-\cos 2\pi(f_c t - \frac{1}{4T}t + \frac{1}{4T}t - \frac{n}{4}) + \cos 2\pi(f_c t - \frac{1}{4T}t - \frac{1}{4T}t + \frac{n}{4})}{\pi(\frac{t}{T} - n)}$$

$$= \sum_{n_{odd}} A_n(-1)^{\frac{n+1}{2}} \frac{-\cos(2\pi f_c t - \pi\frac{n}{2}) + \cos[2\pi(f_c - \frac{1}{2T})t + \pi\frac{n}{2}]}{\pi(\frac{t}{T} - n)}$$

This can be further simplified using the following trigonometric identity:

$$\cos x = \sin(x + \frac{\pi}{2}).$$

Then the following results:

$$i_5(t) = \sum_{n_{odd}} A_n(-1)^{\frac{n+1}{2}} \frac{-\sin(2\pi f_c t - \pi\frac{n}{2} + \pi\frac{1}{2}) + \sin[2\pi(f_c - \frac{1}{2T})t + \pi\frac{n}{2} + \pi\frac{1}{2}]}{\pi(\frac{t}{T} - n)}$$

$$= \sum_{n_{odd}} A_n(-1)^{\frac{n+1}{2}} \frac{-\sin(2\pi f_c t - \pi\frac{n+1}{2} + \pi) + \sin[2\pi(f_c - \frac{1}{2T})t + \pi\frac{n-1}{2}]}{\pi(\frac{t}{T} - n)}$$

$$= \sum_{n_{odd}} A_n(-1)^{\frac{n+1}{2}}(-1)^{\frac{n+1}{2}} \frac{-\sin(2\pi f_c t + \pi) + \sin[2\pi(f_c - \frac{1}{2T})t]}{\pi(\frac{t}{T} - n)}$$

$$i_5(t) = \sum_{n_{odd}} A_n \frac{\sin 2\pi f_c t + \sin 2\pi(f_c - \frac{1}{2T})t}{\pi(\frac{t}{T} - n)}$$

The output summing means then combines signals $i_5(t)$ and $i_6(t)$ to provide $e_o(t)$ as follows:

$$e_o(t) = i_5(t) + i_6(t)$$

$$e_o(t) = \{\sum_{n_{even}} A_n \frac{\sin 2\pi f_c t - \sin 2\pi(f_c - \frac{1}{2T})t}{\pi(\frac{t}{T} - n)}\}$$

$$+ \{\sum_{n_{odd}} A_n \frac{\sin 2\pi f_c t + \sin 2\pi(f_c - \frac{1}{2T})t}{\pi(\frac{t}{T} - n)}\}$$

Figure 3:
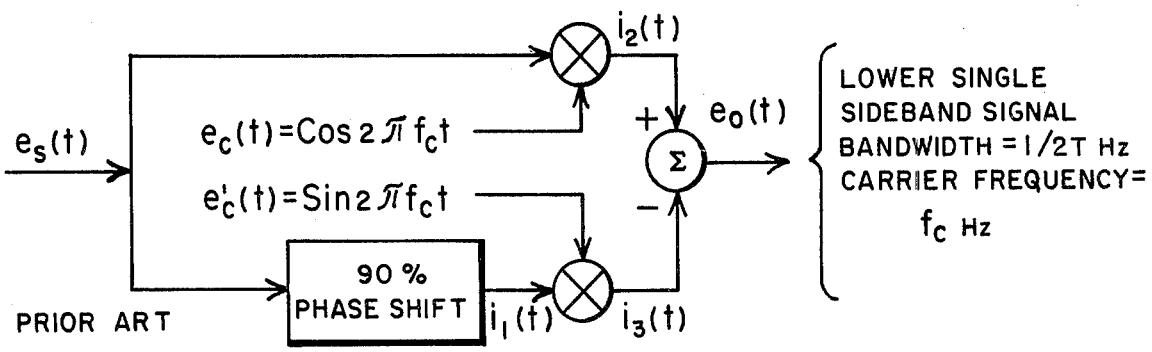
FIG. 3 shows a prior art single sideband transmitter.

Comparing this result with that obtained from the analysis of FIG. 4 shows that the performance of the systems in FIG. 3 and in FIG. 9 are equivalent. Here, of course, this performance is achieved without the use of the 90° phase shifter shown in FIG. 4.

Returning to FIG. 7, the sequence in the parentheses for the values of $g_3(t)$ and $g_4(t)$ also indicate that simplifications can be made in the output portion of the transmitter in FIG. 7 when a convenient choice of carrier wave frequency is made such as the choice in FIG. 7 of $f_c = 3/4T$. Again, zeros in these sequences of values in the parentheses mean that every other sample need not be multiplied out as it will be zero anyway and minus 1's and plus 1's mean merely that the signs need to be changed at appropriate times on the effective data samples forming the output signals of the lowpass filters. A further gain comes in implementing the summing means 27, because the samples coming in from signals $i_5(t)$ and $i_6(t)$ appear alternately. In this situation, the combining required of summing means 27 can be accomplished by merely switching to the summing means output alternately the data samples of which signals $i_5(t)$ and $i_6(t)$ are comprised. Other, higher frequency choices for $f_c$ will also lead to series of 0's, −1's and +1's.

A particularly convenient feature of the transmitter shown in FIGS. 7 and 9 is the ease in which the input signal supplied to the transmitter can be converted into having a (1,0,−1) class 4 partial response format in the transmitter output signal. This signal format has a spectral distribution similar to that shown on frequency axis A in FIG. 8. This, in general, has several advantages for single sideband transmissions because of the lack of substantial frequency components near the reference frequency between the side lobes of the signal in the frequency domain, or in the particular case shown along real frequency axis A of FIG. 8, a dearth of frequency components near zero frequency.

Figure 10:
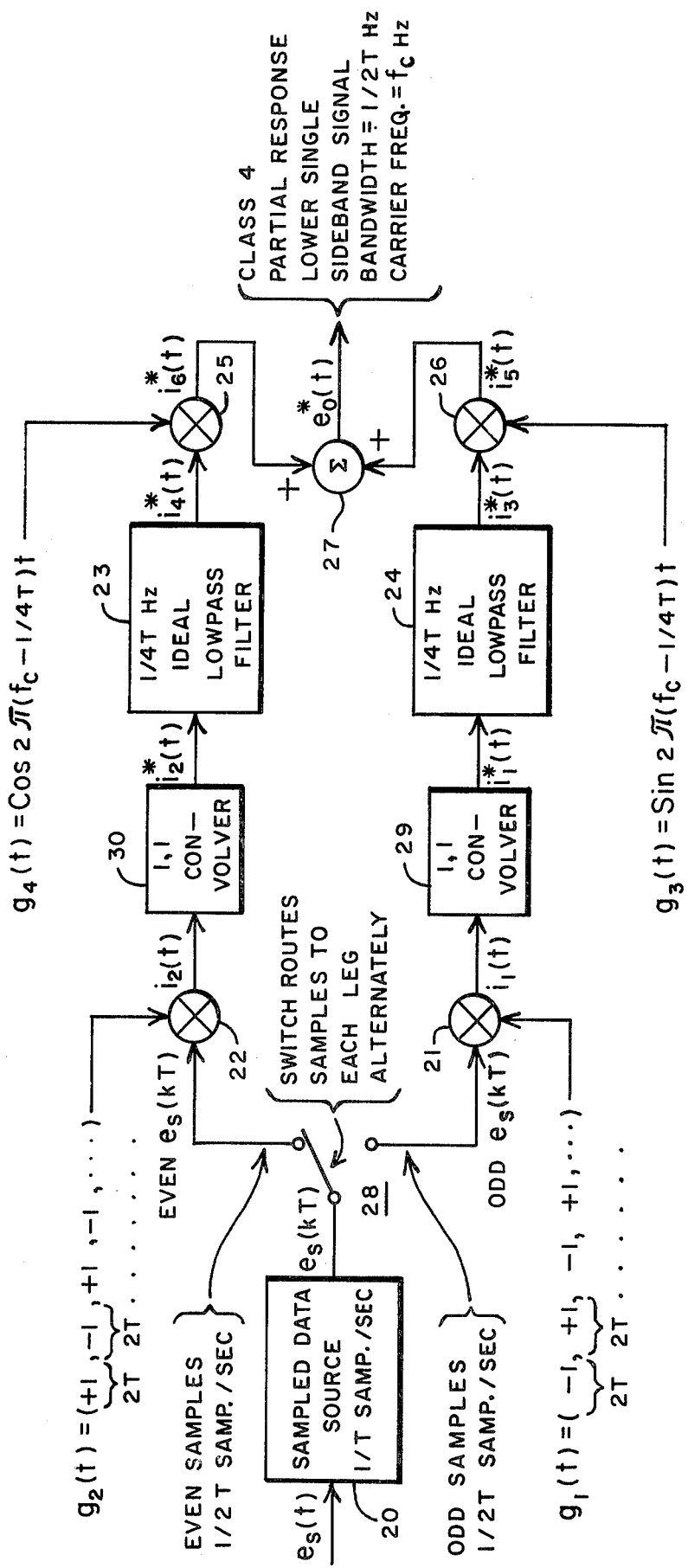
FIG. 10 shows an alternative version of the systems shown in FIGS. 7 and 9.

FIG. 10 is the same as FIG. 9 with the exception of the introduction of two convolvers, 29 and 30, each preceding the ideal lowpass filter provided in each leg of the transmitter. These convolvers act on sampled signals $i_1(t)$ and $i_2(t)$, convolving them with a (1,1) sequence. The result may be viewed as forming new signals $i_1^*(t)$ and $i_2^*(t)$ to be presented to the ideal lowpass filters or the convolvers may be viewed as each being combined with the corresponding ideal lowpass filter to give these filters a new impulse response characteristic as follows:

$$h(t) = \frac{\sin\pi\frac{t}{2T}}{\pi\frac{t}{2T}} + \frac{\sin\pi\frac{t - \frac{1}{2T}}{2T}}{\pi\frac{t - 1/2T}{2T}}$$

The impulse response of these filters may be described as a lowpass filter impulse response repeated twice in time and summed.

The ordinary way of obtaining a (1,0,−1) class 4 partial response is to convolve the following function with the input signal:

(+1,0,−1) CONVOLVING FUNCTION =
[+δ(t−0) + 0δ(t−T) − δ(t−2T)]

The result of this convolution is then supplied to the transmitter for transmission to the receiver.

As was seen above, the earlier analysis of FIG. 9 provided an output equation which consisted of two summation portions with each summation portion in a one to one correspondence with a leg of the transmitter. Thus, because of the symmetry of the summation portions and this one to one correspondence, only the signal $i_5(t)$ or $i_6(t)$ need be analyzed to show the result of having either convolver 29 or convolver 30 present in the corresponding leg of the transmitter of FIG. 9.

To show the system of FIG. 10 gets the proper result, it must first be determined what the receiver output would be when ordinary class 4 partial response methods are used. Thus, the preceding function, (+1,0,−1) CONVOLVING FUNCTION, is convolved with a lowpass filtered version of the baseband signal, but for this analysis for proper comparison, only that signal portion which corresponds to the portion supplied to the one leg of the transmitter in FIG. 10 is to be used. That is, to be converted to a (+1,0,−1) partial response format for this analysis is the signal resulting from passing EVEN $e_s(kT)$ through an ideal lowpass filter confining the input signal to a bandwidth of 1/2T hertz, a filter such as the one which precedes the transmitter shown in FIG. 4. The result of converting this signal to a (+1,0,−1) partial response format for transmission by the transmitter in FIG. 4 is that the signal which is to be sent is also that which is desired to be obtained from the communication receiver after demodulation, i.e. a recovered portion of the baseband signal in a (+1,0,−1) partial response format. The result of lowpass filtering the signal EVEN $e_s(t)$ and convolving it with (+1,0,−1) CONVOLVING FUNCTION yields:

$$e_{recv}(t) = \sum_{n_{even}} A_n \left\{ \frac{\sin[\pi \frac{1}{T} t]}{\pi \frac{1}{T}(t-nT)} - \frac{\sin[\pi \frac{1}{T} t]}{\pi \frac{1}{T}[t-(n+2)T]} \right\}$$

The first term in the braces represents the ordinary received signal while the second term represents the ordinary received signal having an inverted polarity and a delay of 2T seconds.

Returning to FIG. 10, to analyze the performance of the convolver 30 in the leg of the transmitter which has the signal EVEN $e_s(kT)$ supplied to it, signal $i_2(t)$ is repeated for convenience:

$$i_2(t) = \sum_{n_{even}} (-1)^{\frac{n}{2}} [A_n \delta(t - nT)]$$

This must be convolved in convolver 30 with the following (+1,+1) convolving function:

(+1,+1) CONVOLVING FUNCTION =
$[+\delta(t-0) + \delta(t-\Delta t)]$ where $\Delta t = 2T$, i.e. $\Delta t$ equals the period between even channel samples. The result of this convolution is given by:

$$i_2^*(t) = \sum_{n_{even}} (-1)^{\frac{n}{2}} A_n \{\delta(t - nT) + \delta[t - (n+2)T]\}$$

As the convolver 30 is taken as a separate unit in this analysis, the impulse response of filter 23 will again be:

$$h(t) = \frac{\sin \pi \frac{t}{2T}}{\pi \frac{t}{2T}}$$

Then, convolving the filter impulse response with $i_2^*(t)$ yields $i_4^*(t)$:

$$i_4^*(t) = i_2^*(t) * h(t) =$$
$$\sum_{n_{even}} A_n (-1)^{\frac{n}{2}} \left\{ \frac{\sin 2\pi \frac{1}{4T}(t - nT)}{2\pi \frac{1}{4T}(t - nT)} + \frac{\sin 2\pi \frac{1}{4T}[t - (n+2)T]}{2\pi \frac{1}{4T}[t - (n+2)T]} \right\}$$

The signal $i_4^*(t)$ is supplied to multiplier 25 and results in equation $i_6^*(t)$ as follows:

$$i_6^*(t) = g_4(t) i_4^*(t) = \cos[2\pi(f_c - \frac{1}{4T})t] i_4^*(t)$$

$$= \sum_{n_{even}} A_n (-1)^{\frac{n}{2}} \left\{ \frac{\sin[2\pi f_c t - \pi \frac{n}{2}] - \sin[2\pi(f_c - \frac{1}{2T})t + \pi \frac{n}{2}]}{\pi(\frac{t}{T} - n)} + \frac{\sin[2\pi(f_c t - \pi \frac{n}{2} - \pi)] - \sin[2\pi(f_c - \frac{1}{2T})t + \pi \frac{n}{2} + \pi]}{\pi(\frac{t}{T} - n - 2)} \right\}$$

$$i_6^*(t) = \sum_{n_{even}} A_n \left\{ \frac{\sin(2\pi f_c t) - \sin 2\pi(f_c - \frac{1}{2T})t}{\pi(\frac{t}{T} - n)} - \frac{\sin(2\pi f_c t) - \sin 2\pi(f_c - \frac{1}{2T})t}{\pi(\frac{t}{T} - n - 2)} \right\}$$

This half of the transmitter output signal in FIG. 10, $i_6^*(t)$, formed by the even input data samples, must be demodulated to determine the signal resulting in the communications receiver. Using $\cos 2\pi f_c t$ as the demodulating signal and lowpass filtering to reject terms containing the carrier wave frequency or higher frequencies provides the following result:

$$e_{recv}(t) = \cos(2\pi f_c t) \, i_6^*(t) \Big|_{\text{omit } (2f_c) \text{ terms}} =$$

$$\sum_{n_{even}} A_n \frac{+\sin 2\pi(f_c - f_c)t - \sin 2\pi(f_c - \frac{1}{2T} - f_c)t}{\pi(\frac{t}{T} - n)} -$$

$$\frac{\sin 2\pi(f_c - f_c)t - \sin 2\pi(f_c - \frac{1}{2T} - f_c)t}{\pi[\frac{t}{T} - (n+2)]}$$

$$e_{recv}(t) = \sum_{n_{even}} A_n \frac{\sin[\pi \frac{1}{T} t]}{\pi \frac{1}{T}(t - nT)} - \frac{\sin[\pi \frac{1}{T} t]}{\pi \frac{1}{T}[t - (n+2)T]}$$

This provides exactly the same result as the communications receiver baseband signal and the input data signals convolved with the sequence (+1,0,−1).

As has been previously indicated, the requirement for an ideal filter limits the performance achievable by the foregoing transmitters if substantial frequency components near the reference frequency between the side lobes in the baseband or the passband of an input signal are present. This is particularly true where there is a substantial bandwidth and where rapid data rates are involved. The use of a transversal filter for the filters shown in the FIGS. 7, 9 and 10 have substantial advantages in providing nearly the ideal filter characteristic desired and doing so for a high data rate. Use of such a transversal filter in form of a nonrecursive digital filter in a digital version of FIG. 10 provides a very effective digital, class 4 partial response, single sideband transmitter. Use in FIGS. 7 or 9 will, of course, merely omit a a duobinary format in the data sent.

There are four particularly significant differences between the performance of such a transversal filter in a digital implementation and the response of an ideal filter. First, the digital filter output contains quantization noise because of the quantization of the samples supplied to the filter and because of the quantization of the weighting applied to these samples in the filter. Some compromise must be struck between the number of bits allowed in a digital word and a tolerable amount of quantization noise.

Second, the ideal filter impulse response is infinitely long in the time domain whereas the impulse response of a practical digital filter must be finite. However, for a given accuracy, the required length of the impulse response of the digital filter shortens significantly by using a duobinary (+1,+1) partial response impulse response convolved with a sin x/x ideal filter response rather than merely using a sin x/x ideal filter response alone. This is because cancellation occurs in the tails of the two sin x/x portions of a (+1,+1) partial response impulse response which acts to confine the significant overall impulse response in time to being relatively near the major portions of the impulse response.

The digital filters inevitably introduce added delay as against the ideal filter response of zero delay. However, the delay is essentially the same in a digital filter for all of the frequency components of the signal and so the waveform shape of a signal emerging therefrom is not altered but a small delay is added thereto. Typically, the addition of a small delay is unimportant given the delays occurring in the transmission of the signal in the channel, etc.

Finally, since a digital filter computes output data points for only discrete points in time the signal is in a sample data form and when converted to analog form will leave images of the output signal distributed about the harmonics of the effective sampling rate. If the effective sampling rate is chosen high enough to separate these images, the undesired images can be filtered off with ordinary filters.

Figure 11:
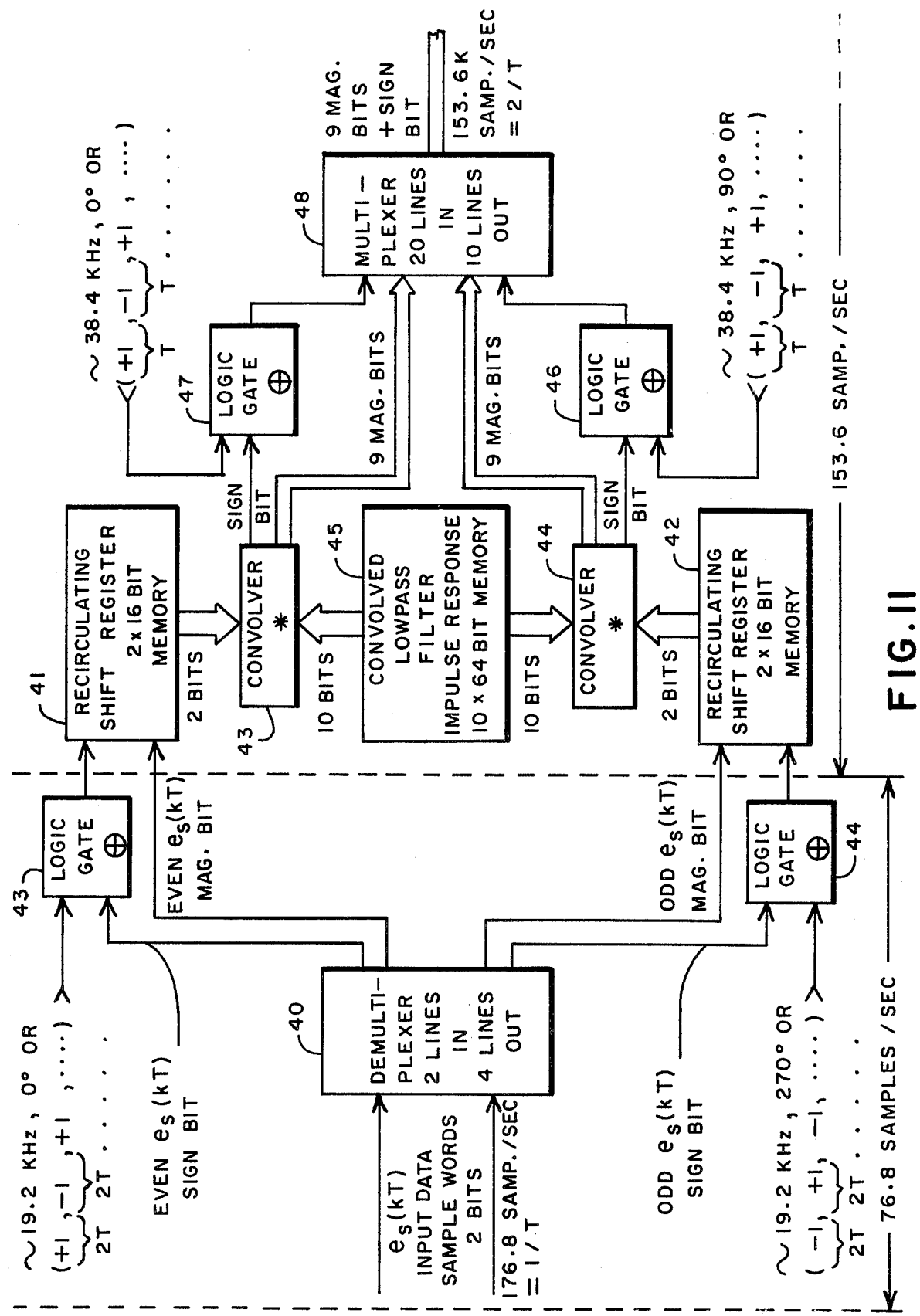
FIG. 11 shows a digitized alternative version of the systems shown in FIGS. 7, 9 and 10.
Figure 11:
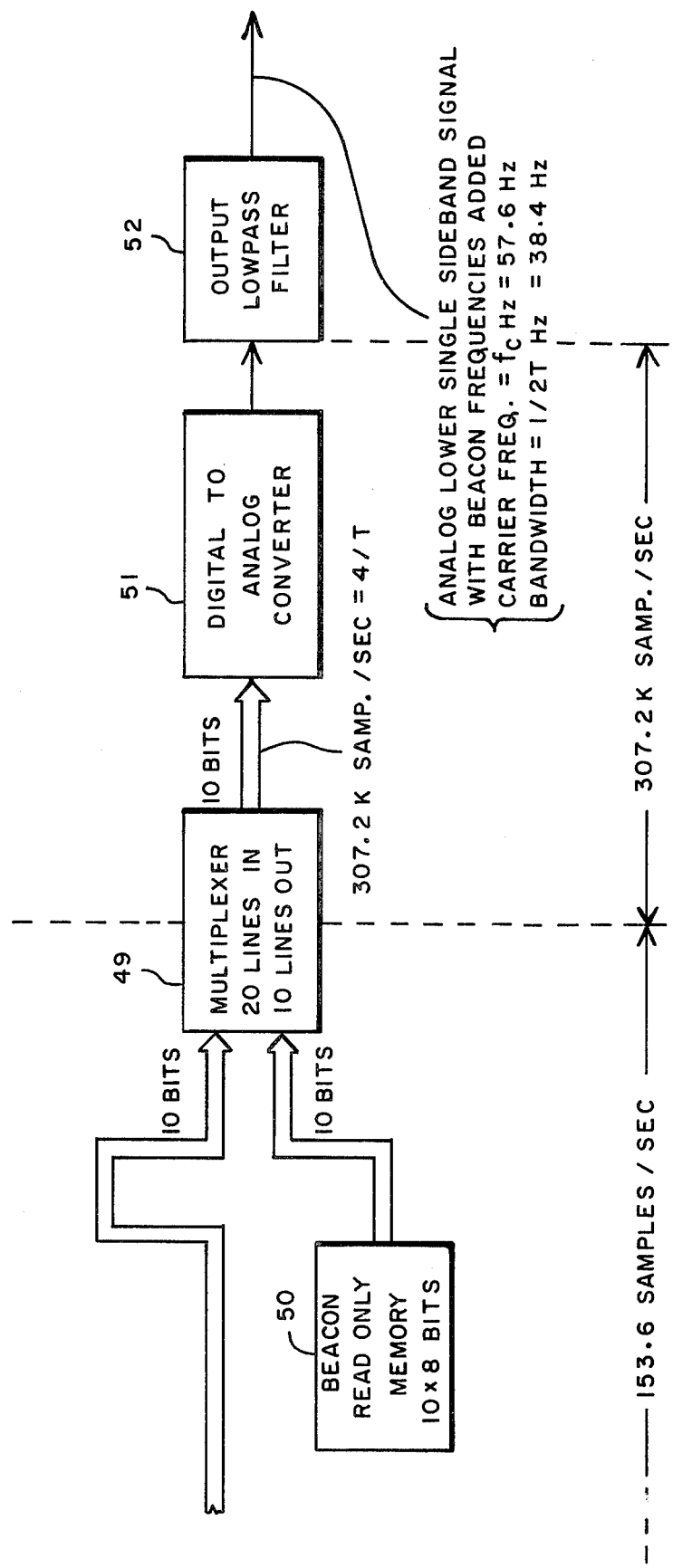

FIG. 11 presents a digitized version of a discrete time transmitter of FIG. 10, with certain additional features, where $f_c$ is again chosen to equal 3/4T as in FIG. 7. The input signal, $e_s(kT)$, comprises a sequence of discrete input data samples, one in each time period T. Each input data sample is taken as a digital word in a sign bit plus magnitude bits format, there being one sign bit and one magnitude bit in the example of FIG. 11. These input data samples are presented to a demultiplexer, 40, which directs the even input data samples to the upper leg of the transmitter and the odd data samples to the lower leg of the transmitter. The demultiplexer 40 serves as the switch 28 in FIGS. 9 and 10.

The magnitude bits of the even input data samples go directly to a 16 position shift register, 41. The odd input data samples go to a 16 bit shift register also, 42. However, the sign bits are treated differently.

The sign bit of the even input data samples first goes to EXCLUSIVE OR logic gate, 43, where the sequence in parentheses without zeros as in FIGS. 9 and 10, is effectively applied to the other input of this gate. Every other one of the even input data sample word sign bits is complemented. This is the same as changing the sign of every other even input data sample to achieve the same effect as multiplying by the alternating plus 1's and minus 1's shown in the parentheses. The odd input data sample word sign bits are supplied to the EXCLUSIVE OR logic gate, 44, where they are operated on as described for the even input data sample word sign bits. Of course, the sign bits are matched with the corresponding magnitude bits in each position in the corresponding shift registers 41 and 42.

An even input sample is presented to circulating shift register 41 every two T seconds and an odd input data sample is presented to recirculating shift register 42 every two T seconds also, although each receive them at different points in the time period two T, i.e. the even and odd input data samples are presented with different phases. As is indicated in FIG. 11, the sample rate in this portion of the transmitter must double and so output samples from each of the convolvers, 43 and 44, must be provided once every T seconds. To accomplish this as is set out below, the data samples in each of the recirculating shift registers 41 and 42 must be recirculated once every T seconds while adding a new input data sample in each recirculating shift register once every two T seconds. The oldest data sample in the recirculating shift registers 41 and 42 are dropped once every two T seconds.

The convolved lowpass filter impulse response storage memory, 45, contains, for supply to each of the convolvers 43 and 44, thirty-two samples of the desired filter impulse response making a total of 64 samples stored. The desired response, as indicated in connection with FIG. 10 when viewing each convolver shown there combined with its corresponding lowpass filter, is as follows:

$$h(t) = \frac{\sin \pi \frac{t}{2T}}{\pi \frac{t}{2T}} + \frac{\sin \pi \frac{t - \frac{1}{2T}}{2T}}{\pi \frac{t - \frac{1}{2T}}{2T}}$$

The convolvers 43 and 44 of FIG. 11 comprise both a digital multiplier and a digital accumulator. The most recent sample in recirculating shift register 42 is presented to the multiplier together with the first sample in the impulse function stored in memory 45. These are multiplied together and the product stored in the accumulator of convolver 43. Then, the recirculating shift register 41 shifts one storage position while recirculating memory 45 shifts two storage positions and the samples in these respective positions are again presented to the multiplier of convolver 43 and the resulting product is added into the accumulator total of convolver 43. Thus, every other sample stored in memory 45 is skipped during the first recirculation of shift register 41. These multiplications and additions continue until the 16 data samples in recirculating shift register 41 have been shifted through completely a first time to provide a convolver first output in time period 2T.

The data samples in recirculating shift register 41 are recirculated again, but this time multiplying those samples from memory 45 which were not used during the first recirculation of shift register 41, to provide a convolver second output in time T2. Each of these recirculations of the data samples in recirculating shift register 41 can take no more than T seconds if output samples are to be provided uniformly. At the end of the second recirculation of a new data sample is received from the logic gate 43 and the oldest data sample previously received from logic gate 43 is dropped as indicated above. Exactly the same sequence of events occurs with respect to recirculating shift register 42, although the outputs from convolver 44 come with a different phase relationship when compared to the outputs of convolver 43. Convolver 44 again has a digital multiplier and a digital accumulator therein.

The output from these two convolvers are digital words in a sign and magnitude format having 9 magnitude bits plus a sign bit; each convolver providing one such digital word every T seconds. The sign bits are supplied to EXCLUSIVE OR logic gates, 46 and 47. As the sequence in the parentheses again shows, only the sign bits in the samples or digital words supplied to the logic gate 46 and 47 need be operated upon such that every other one of the incoming digital words have the associated sign bits complemented.

The magnitude bits are supplied directly to multiplexer 48 and the corresponding sign bits are also supplied to the multiplexer at the proper time. The samples or digital words coming from the logic gates 46 and 47 arrive alternately in time and so the multiplexer need merely shift these to its output to form an output signal which, of course, consists of digital words having nine magnitude bits plus a sign bit. This output signal from multiplexer 48 is supplied to multiplexer 49.

Also supplied to multiplexer 49, are ten bit digital words which are the output of beacon read only memory, 50. To place a beacon signal at either side of the single sideband output frequency axis lobe requires adding frequencies 19.2 kilohertz and 57.6 kilohertz as is shown along frequency axis P of FIG. 8. The sample rate of multiplexer 48 output is 153.6k samples per second and coming into multiplexer 49. Thus, there would be eight beacon samples taken of a 19.2 kilohertz beacon frequency during one cycle thereof to provide samples at the same rate as the multiplexer 48 output and so only eight sample values need be stored in the beacon memory 50. The 57.6 kilohertz beacon will complete three cycles during the period of the 19.2 kilohertz beacon and so both beacons will repeat every eight samples. Thus, the composite wave form for these two beacon signals need have only eight samples taken thereof and stored in a read only memory to be available for insertion. The read only memory is therefore an eight word by 10 bit memory.

The multiplexer 49 then alternately directs to the output thereof the translated data samples or digital words from multiplexer 48 and the beacon samples or digital words from memory 50 in time to provide an output signal having sample rate of 4/T samples/second or 307.2k samples/second.

Often the output signal from multiplexer 49 will be desired to be converted into an analog signal, perhaps for translation up to higher frequencies for subsequent transmission purposes. A digital to analog converter means, 51, can be used to accomplish this. Typically, the format of the digital word will be changed in D/A means 51 from sign and magnitude to another more convenient format. Also D/A means 51 will hold the output result for some period of time which will result in a filtering action. This might be modeled by having a sample and hold, i.e. "boxcar", circuit acting as the filter following a digital to analog converter which provides only instantaneous outputs. The result of this holding will be a filtering occurring in the frequency domain.

Returning to FIG. 8, the filtering characteristic of the "boxcar" circuit is indicated by the filter characteristic shown along frequency axis U. The output of a digital to analog converter providing instantaneous outputs will be that shown along frequency axis R. Multiplying the digital to analog converter filtering characteristic shown along frequency axis R by the frequency domain output shown along frequency axis U gives the output shown along frequency axis V. The frequency domain output shown along frequency axis V is then supplied to an output lowpass filter, 52, shown in FIG. 11 having the output filter characteristics shown along frequency axis S of FIG. 8. Again, the output signal of the output lowpass filter is shown along frequency axis T in FIG. 8.

The lower sideband has been provided by all of the transmitters shown in the Figures referenced in the foregoing. However, the upper sideband may be transmitted by merely changing one of the signs at the output summer where appropriate, or changing the signs or relative phases of any of the translating signals $g_1(t)$ through $g_4(t)$, or by inverting signs somewhere along the signal paths in the legs of the transmitters.

Also, the frequency diagrams have shown providing a single sideband signal translated up the frequency axis assuming that the input signal is symmetrically distributed about a reference signal of zero hertz with sort of a sideband, i.e. a frequency lobe, on either side of zero hertz confined to being between reference frequencies at the outside of the sidebands. As indicated above, the transmitter shown will also operate on a double sideband signal which is symmetrical about another reference signal, other than zero hertz, for providing a single sideband signal version thereof translated to a different frequency.

Finally, as has been indicated by the descriptions of some of the transmitter versions shown in the Figures, it is possible to change the signal format at various points in the transmitters between analog versions, discrete time versions, and digitized discrete time versions. Further combinations are possible beyond those shown in the Figures such as by using digital to analog converters and analog to digital converters at various places in the legs of the transmitter.

The embodiments of the invention in which an exclusive property or right is claimed are defined as follows:

1. A single sideband transmitter for frequency translating an input signal, providing by an input signal source, having a frequency content, in a frequency domain representation thereof, occurring between second and third reference frequencies each of which occurs on a side of a first reference frequency where said third reference frequency exceeds said second reference frequency, a first bandwidth comprising those frequencies which occur between said second reference frequency and said third reference frequency, said transmitter comprising:

a first translating means to receive said input signal from said input signal source, said first translating means being capable of translating said input signal in frequency, in an amount equal to a first frequency shift, by effective multiplication of said input signal with a periodic first translating signal from a first translating signal source to thereby provide a first intermediate signal, said first frequency shift being sufficient to provide a replica of said frequency content between a first selected frequency and a second selected frequency where said second selected frequency is less than said third reference frequency but exceeds said first selected frequency;

a second translating means to also receive said input signal from said input signal source, said second translating means being capable of translating said input signal in frequency, in an amount equal to a second frequency shift, by effective multiplication of said input signal with a periodic second translating signal from a second translating signal source to thereby provide a second intermediate signal;

a first filtering means to receive said first intermediate signal, said first filtering means having as its impulse response a first filter impulse response, repeated twice in time and summed, of a filter capable of filtering said first intermediate signal about said first reference frequency to substantially remove frequencies therein which occur approximately beyond said second selected frequency, said first filtering means filtering said first intermediate signal to provide a third intermediate signal;

a second filtering means to receive said second intermediate signal, said second filtering means having as its impulse response a second filter impulse response, repeated twice in time and summed, of a filter capable of filtering said second intermediate signal about said first reference frequency to substantially remove frequencies therein which occur approximately beyond said second selected frequency, said second filtering means filtering said second intermediate signal to provide a fourth intermediate signal;

a third translating means to receive said third intermediate signal, said third translating means for translating said third intermediate signal in frequency, in an amount equal to a third frequency shift, by effective multiplication of said third intermediate signal with a periodic third translating signal from a third translating signal source to thereby provide a fifth intermediate signal, said third frequency shift differing from said first frequency shift;

a fourth translating means to receive said fourth intermediate signal, said fourth translating means for translating said fourth intermediate signal in frequency, in an amount equal to a fourth frequency shift, by effective multiplication of said fourth intermediate signal with a periodic fourth translating signal from a fourth translating signal source to thereby provide a sixth intermediate signal; and a summing means to receive said fifth and sixth intermediate signals, said summing means being capable of combining said fifth and sixth intermediate signals to form a combined signal serving as a first transmitter output signal.

2. The apparatus of claim 1 wherein said second frequency shift approximately equals said first frequency shift.

3. The apparatus of claim 1 wherein said third frequency shift substantially equals said fourth frequency shift.

4. The apparatus of claim 2 wherein said first frequency shift is substantially equal to that band of frequencies occurring between said first reference frequency and that frequency which divides said first bandwidth into halves.

5. The apparatus of claim 3 wherein said third frequency shift is substantially equal to a selected carrier frequency less one-half of said first bandwidth.

6. The apparatus of claim 1 wherein said first and second filter impulse responses are those of a lowpass filter.

7. The apparatus of claim 1 wherein said first and second filtering means each contain a 1,1 sequence convolver and a lowpass filter in series, said first reference frequency being zero.

8. The apparatus of claim 3 wherein said first frequency shift is substantially equal to that band of frequencies occurring between said first reference frequency and that frequency which divides said first bandwidth into halves and wherein said third frequency shift is substantially equal to a selected carrier frequency less one-half of said first bandwidth.

9. The apparatus of claim 3 wherein said second translating signal has a first period which is that of said first translating signal but has a phase difference relative thereto; and, said fourth translating signal has a second period which is that of said third translating signal but has a phase difference relative thereto.

10. The apparatus of claim 9 wherein said input signal is an analog signal, said first translating signal follows a sine time function, said second translating signal follows a cosine time function, and said third and fourth translating signals follow sinusoidal time functions in quadrature with one another.

11. The apparatus of claim 9 wherein said input signal is a discrete time signal comprising sequentially presented discrete time input data samples, there being one said input data sample provided per sample period, said first translating signal follows a sine time function, said second translating signal follows a cosine time function, and said third and fourth translating signals follow sinusoidal time functions in quadrature with one another.

12. The apparatus of claim 9 wherein said input signal is a discrete time signal comprising sequentially presented discrete time input data samples, there being one said input data sample provided per sample period, and wherein said first and second translating means share commonly a demultiplexer means to receive said input signal with said demultiplexer means providing every other input data sample to be effectively multiplied by said first translating signal as said and providing all other input data samples to be effectively multiplied by said second translating signal as said, and wherein said first translating signal follows a sine time function, said second translating signal follows a cosine time function, and said third and fourth translating signals follow sinusoidal time functions in quadrature with one another.

13. The apparatus of claim 10 wherein said first and second translating signals are continuous signals having a frequency substantially equal to that frequency which divides said first bandwidth into halves.

14. The apparatus of claim 10 wherein said first and second translating signals are discrete time signals each comprising four samples in said first period with said first period being substantially equal to a reciprocal of that frequency which divides said first bandwidth into halves.

15. The apparatus of claim 11 wherein said first and second translating signals are discrete time signals each comprising one sample per said sample period with said first period being substantially equal to four said sample periods summed.

16. The apparatus of claim 12 wherein said first and second translating signals are discrete time signals each comprising one sample per two said sample periods with said first period being substantially equal to four said sample periods summed.

17. The apparatus of claim 15 wherein said third and fourth translating signals are discrete time signals comprising four samples in said second period with said second period being substantially equal to two said sample periods summed.

18. The apparatus of claim 15 wherein said third and fourth translating signals are discrete time signals comprising two samples in said second period with said second period being substantially equal to two said sample periods summed.

19. The apparatus of claim 16 wherein said third and fourth translating signals are discrete time signals comprising four samples in said second period with said second period being substantially equal to two said sample periods summed.

20. The apparatus of claim 16 wherein said third and fourth translating signals are discrete time signals comprising two samples in said second period with said second period being substantially equal to two said sample periods summed.

21. The apparatus of claim 18 wherein said input signal and said first, second, third and fourth translating signals have samples therein provided as digital words, said first, second, third and fourth translating means each comprise an EXCLUSIVE OR logic gate, said summing means comprises a multiplexer, said first filtering means comprises a transversal filter, and said second filtering means comprises a transversal filter.

22. The apparatus of claim 20 wherein said input signal and said first, second, third and fourth translating signals have samples therein provided as digital words, said first, second, third and fourth translating means each comprise an EXCLUSIVE OR logic gate, said summing means comprises a multiplexer, said first filtering means comprises a transversal filter, and said second filtering means comprises a transversal filter.

23. A digital single sideband transmitter for frequency translating a digital discrete time input signal comprising sequentially presented discrete time input data samples formed as m-bit digital words provided from an input signal source, there being one said input data sample provided per sample period, said transmitter comprising:

a demultiplexer means to receive said input signal, said demultiplexer means providing every other input data sample at a first demultiplexer means output to form a first demultiplexer means output signal comprising samples formed as digital words, and providing all other input data samples at a second demultiplexer means output to form a second demultiplexer means output signal comprising samples formed as digital words;

a first sign changing means to receive said first demultiplexer means output signal, said first sign changing means changing signs of every other digital word in said first demultiplexing means output signal to thereby form a first sign changing means output signal comprising samples formed as digital words;

a second sign changing means to receive said second demultiplexer means output signal, said second sign changing means changing signs of every other digital word in said second demultiplexer means output signal to thereby form a second sign changing means output signal comprising samples formed as digital words;

a first digital filtering means to receive said first sign changing means output signal, said first digital filtering means having samples, formed as digital words, of a selected first impulse response stored therein, said first impulse response being digitally convolved by said first digital filtering means with said first sign changing means output signal to provide a first digital filtering means output signal comprising digital words;

a second digital filtering means to receive said second sign changing means output signal, said second digital filtering means having samples, formed as digital words, of a selected second impulse response stored therein, said second impulse response being digitally convolved by said second digital filtering means with said second sign changing means output signal to provide a second digital filtering means output signal comprising digital words;

a third sign changing means to receive said first digital filtering means output signal, said third sign changing means changing signs of digital words in said first digital filtering means output signal to thereby form a third sign changing means output signal comprising digital words;

a fourth sign changing means signal to receive said second digital filtering means output signal, said fourth sign changing means changing signs of digital words in said second digital filtering means output signal to thereby form a fourth sign changing means output signal comprising digital words; and a first multiplexer means to receive both said third sign changing means output signal and said fourth sign changing means output signal, said first multiplexer means being capable of combining in time said third sign changing means output signal and said fourth sign changing means output signal to form a combined signal comprising digital words serving as a first transmitter output signal.

24. The apparatus of claim 23 wherein said first digital filtering means provides a plurality of digital words in said first digital filtering means output signal for each digital word received in said first sign changing means output signal; and, wherein said second digital filtering means provides a plurality of digital words in said second digital filtering means output signal for each digital word received in said second sign changing means output signal.

25. The apparatus of claim 24 wherein each of said plurality of digital words in said first digital filtering means output signal is formed using a different set of stored samples of said first impulse function; and, wherein each of said plurality of digital words in said second digital filtering means output signal is formed using a different set of stored samples of said second impulse function.

26. The apparatus of claim 24 wherein there are two digital words in said first digital filtering means output signal for each digital word received in said first sign changing means output signal and said third sign changing means changes signs of every other digital word in said first digital filtering means output signal; and, wherein there are two digital words in said second digital filtering means output signal for each digital word received in said second sign changing means output signal and said fourth sign changing means changes signs of every other digital word in said second digital filtering means output signal.

27. The apparatus of claim 26 wherein said first, second, third and fourth sign changing means comprise EXCLUSIVE OR logic gates.

28. The apparatus of claim 27 wherein each kind of output signal recited comprises digital words formed in a sign bit plus one or more magnitude bits format.

29. The apparatus of claim 23 wherein said first and second impulse responses are impulse responses of a lowpass filter repeated twice in time, said lowpass filter having a cutoff frequency equal to that frequency which divides into halves that frequency band taken up by said input signal.

30. The apparatus of claim 23 wherein there is also provided:
   a beacon frequency storage means having samples, formed as digital words, of one or more beacon frequencies stored therein, said beacon frequency samples being provided by said beacon frequency storage means in a timed relationship with said first transmitter output signal to form a beacon frequency storage means output signal comprising digital words; and
   a second multiplexer means to receive both said first transmitter output signal and said beacon frequency storage means output signal, said second multiplexer means being capable of combining in time said first transmitter output signal and said beacon frequency storage means output signal to form a combined signal comprising digital words serving as a second transmitter output signal.

31. The apparatus of claim 30 wherein said second transmitter output signal is received by a digital-to-analog converter means.

32. The apparatus of claim 24 wherein said first and second impulse responses are impulse responses of a lowpass filter repeated twice in time, said lowpass filter having a cutoff frequency equal to that frequency which is halfway between zero frequency and that frequency which divides into halves that frequency band taken up by said input signal.

33. The apparatus of claim 24 wherein there is also provided:
   a beacon frequency storage means having samples, formed as digital words, of one or more beacon frequencies stored therein, said beacon frequency samples being provided by said beacon frequency storage means in a timed relationship with said first transmitter output signal to form a beacon frequency storage means output signal comprising digital words; and
   a second multiplexer means to receive both said first transmitter output signal and said beacon frequency storage means output signal, said second multiplexer means being capable of combining in time said first transmitter output signal and said beacon frequency storage means output signal to form a combined signal comprising digital words serving as a second transmitter output signal.

34. The apparatus of claim 33 wherein said second transmitter output signal is received by a digital-to-analog converter means.

* * * * *